(12) United States Patent
Ebine et al.

(10) Patent No.: US 9,053,902 B2
(45) Date of Patent: Jun. 9, 2015

(54) CHARGED-PARTICLE RADIATION APPARATUS

(71) Applicants: Hitachi High-Technologies Corporation, Minato-ku, Tokyo (JP); TOTO LTD., Kitakyushu-shi, Fukuoka (JP)

(72) Inventors: Yuta Ebine, Tokyo (JP); Shinichi Tomita, Tokyo (JP); Sukehiro Ito, Tokyo (JP); Toshihiro Aoshima, Kitakyushu (JP)

(73) Assignees: Hitachi High-Technologies Corporation, Tokyo (JP); TOTO LTD., Kitakyushu-shi, Fukuoka (JP)

(*) Notice: Subject to any disclaimer, the term of this patent is extended or adjusted under 35 U.S.C. 154(b) by 0 days.

(21) Appl. No.: 14/356,191

(22) PCT Filed: Nov. 12, 2012

(86) PCT No.: PCT/JP2012/079313
§ 371 (c)(1),
(2) Date: May 5, 2014

(87) PCT Pub. No.: WO2013/077217
PCT Pub. Date: May 30, 2013

(65) Prior Publication Data
US 2014/0284477 A1 Sep. 25, 2014

(30) Foreign Application Priority Data
Nov. 25, 2011 (JP) ................................. 2011-257056

(51) Int. Cl.
*H01J 37/26* (2006.01)
*G21K 5/00* (2006.01)
(Continued)

(52) U.S. Cl.
CPC ............. *H01J 37/244* (2013.01); *H01J 37/252* (2013.01); *H01J 37/261* (2013.01)

(58) Field of Classification Search
USPC ............. 250/396 R, 397, 305, 306, 307, 309, 250/310, 311, 492.1, 492.2, 492.3
See application file for complete search history.

(56) References Cited

U.S. PATENT DOCUMENTS 6,031,230 A * 2/2000 Toumatsu ..................... 250/310
2004/0208280 A1 10/2004 Yada et al.
(Continued)

FOREIGN PATENT DOCUMENTS

JP 58-174856 U 11/1983
(Continued)

*Primary Examiner* — Nicole Ippolito
(74) *Attorney, Agent, or Firm* — Miles & Stockbridge P.C.

(57) ABSTRACT

In order to provide a charged-particle radiation apparatus capable of evaluating and distinguishing the analysis position in a sample subjected to X-ray analysis in the stage before performing X-ray elemental analysis, and also making it possible for an analyst to perform, in a short period of time and without reworking, analysis for which high reliability is ensured, the present invention provides a charged-particle radiation apparatus provided with an X-ray detector, wherein a first back scattered electron detector (15) on the same axis as the X-ray detection surface of the X-ray detector (12 (25-30)) is disposed integrally with or independently from the X-ray detector (12), an X-ray signal being detected by the X-ray detector (12) simultaneously with or separately from detection of a back scattered electron signal by the first back scattered electron detector (15).

18 Claims, 18 Drawing Sheets

(51) Int. Cl.
*H01J 37/252* (2006.01)
*H01J 37/244* (2006.01)

(56) References Cited

U.S. PATENT DOCUMENTS

2006/0219914 A1    10/2006  Suga et al.
2011/0031215 A1*    2/2011  Mantz et al. .................... 216/60
2013/0299698 A1*   11/2013  Schamber et al. ............ 250/310

FOREIGN PATENT DOCUMENTS

| JP | 03-048852 U    | 5/1991 |
| JP | 2004-138461 A  | 5/2004 |
| JP | 2006-252995 A  | 9/2006 |
| JP | 2009-181922 A  | 8/2009 |
| JP | 2011-040384 A  | 2/2011 |
| WO | WO 2012/016198 A2 | 2/2012 |

* cited by examiner

FIG. 3A
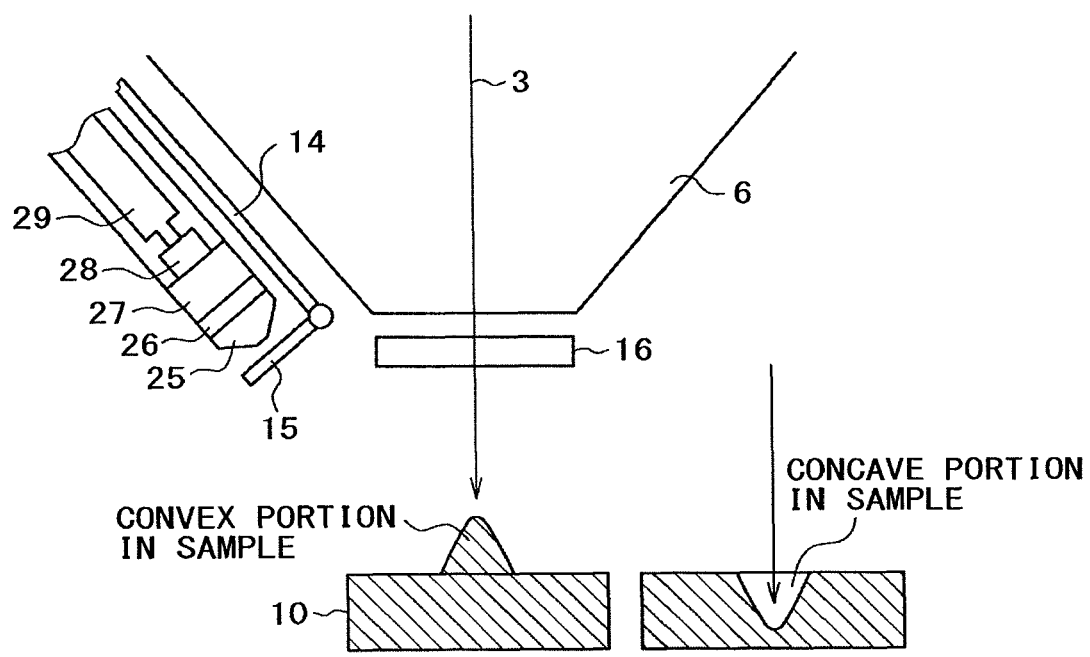
FIG. 3B
DISPOSITION DIRECTION
OF COAX-BSE DETECTOR
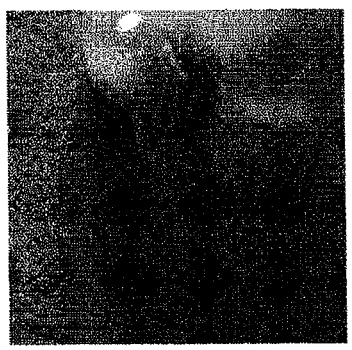
COAX-BSE IMAGE
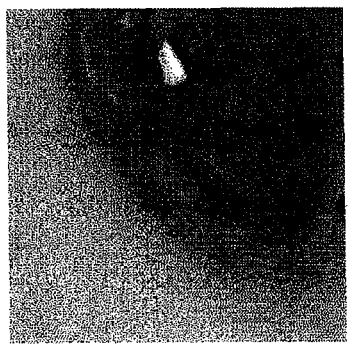
TOP-BSE IMAGE F I G . 1 1
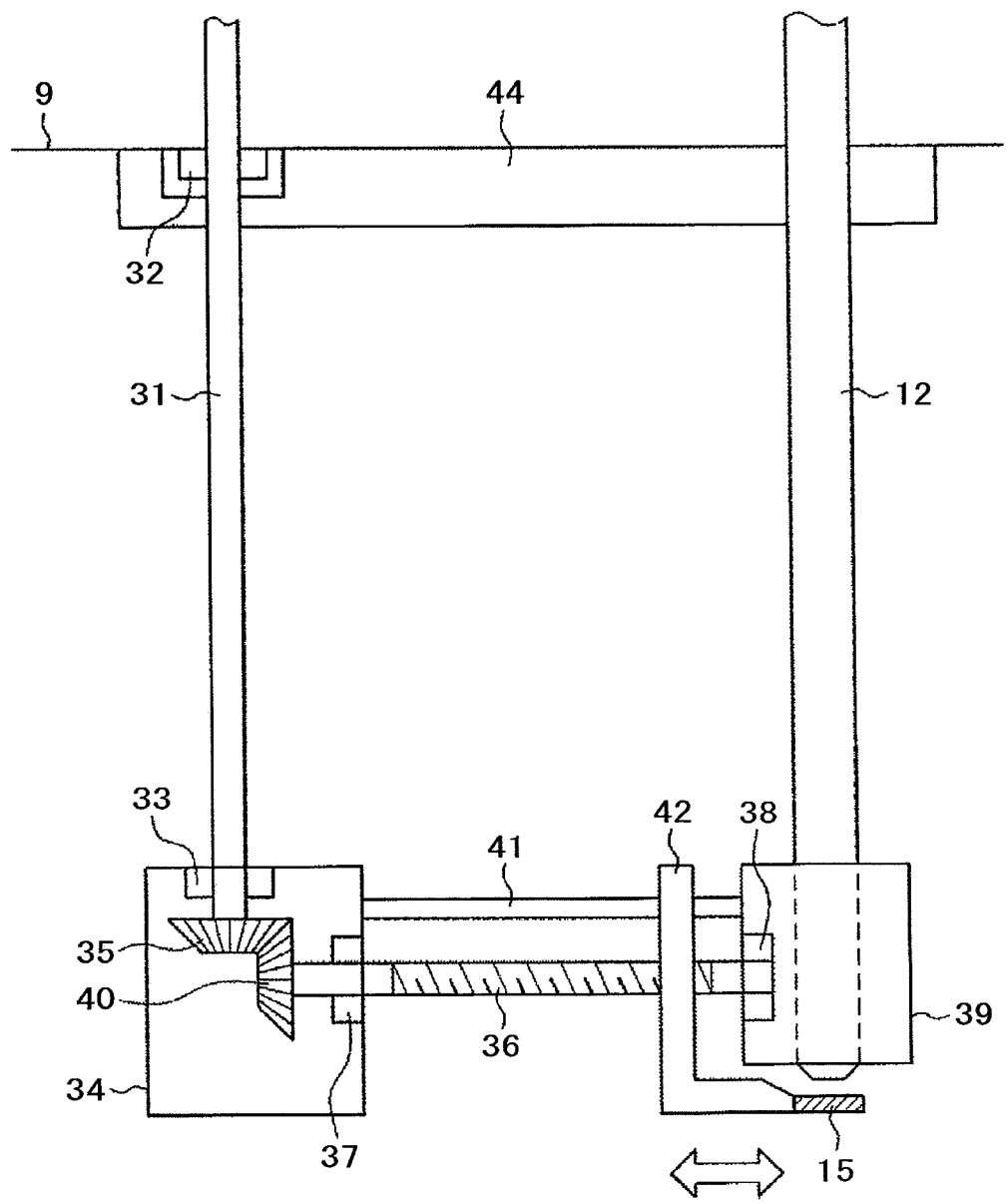

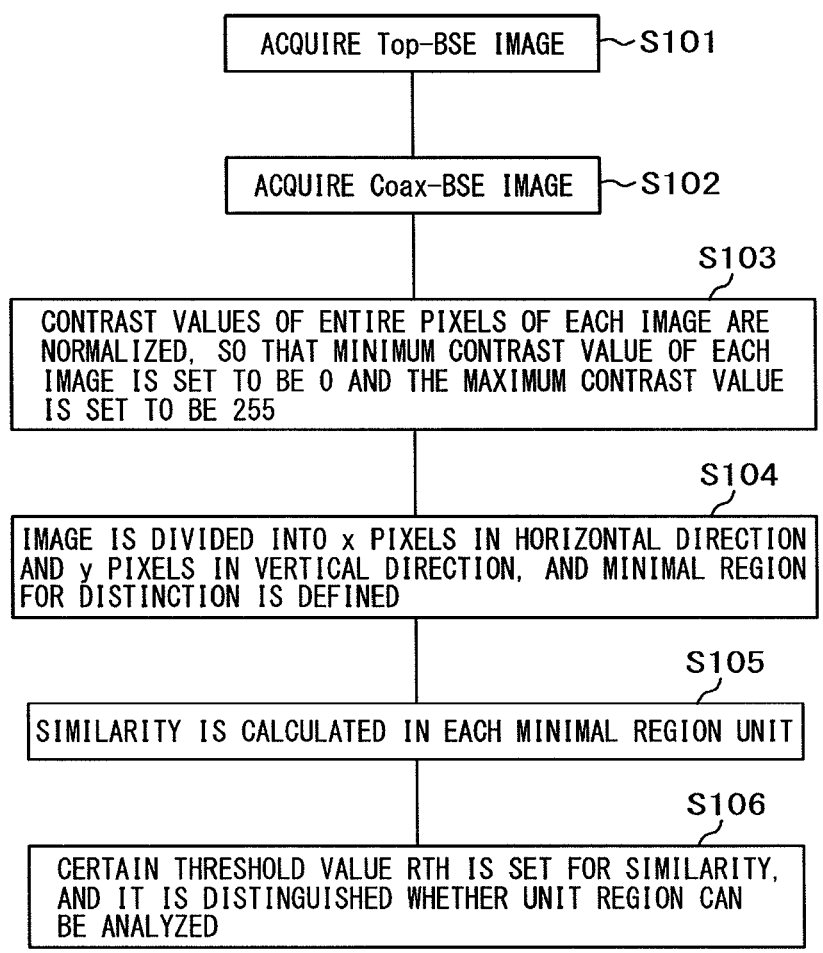

FIG. 17A
FIG. 17B
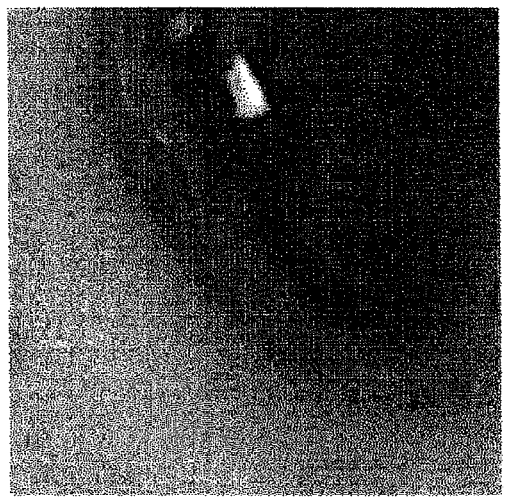
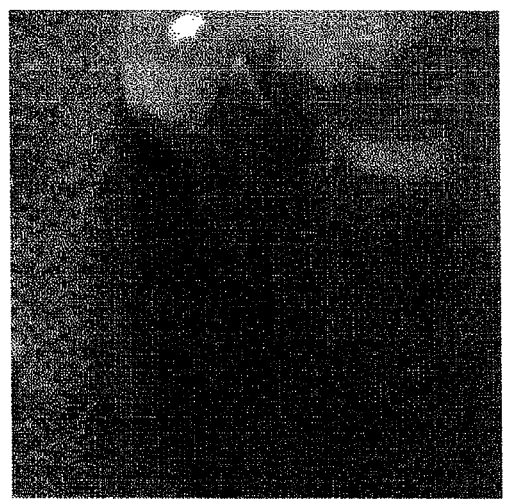
FIG. 17C
FIG. 17D

FIG. 20A
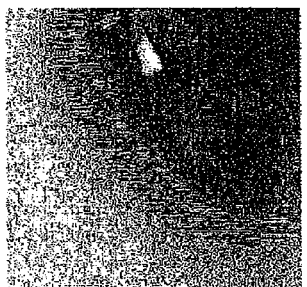
Top-BSE IMAGE
Coax-BSE IMAGE
DISPLAY OF ANALYZABLE REGION
FIG. 20B
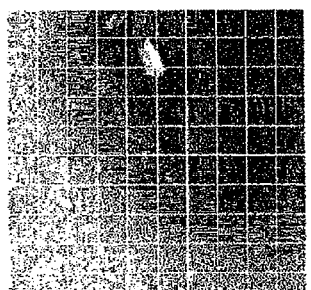
Top-BSE IMAGE
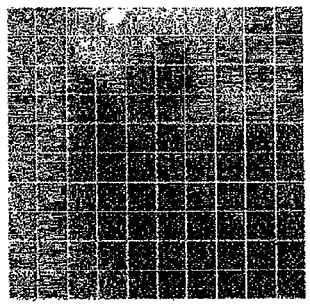
Coax-BSE IMAGE
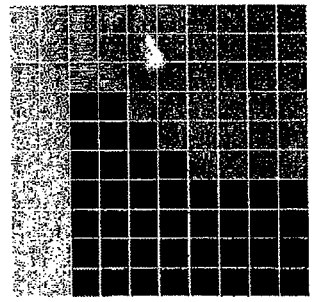
DISPLAY OF ANALYZABLE REGION
FIG. 20C
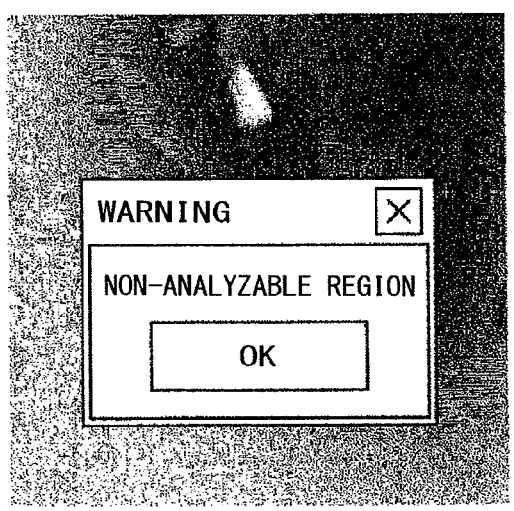

CHARGED-PARTICLE RADIATION APPARATUS

TECHNICAL FIELD

The present invention relates to a charged-particle radiation apparatus provided with an X-ray detector.

BACKGROUND ART

X-ray elemental analysis using a charged-particle radiation apparatus represented by a scanning electron microscope is performed in such a way that: an analysis position is arbitrarily determined while images are being acquired with both a secondary electron detector and a BSE (Back Scattered Electron) detector disposed between an objective lens and a sample surface; and a characteristic X-ray is detected with an X-ray detector located at an angular position different from the BSE detector.

As a method of acquiring an optimal X-ray elemental analysis position in a sample, a technique, in which the three-dimensional shape of the sample is acquired to control a specimen stage in accordance with the shape thereof, is disclosed in Japanese Unexamined Patent Publication 2009-181922 (Patent Document 1).

RELATED ART DOCUMENT

Patent Document

Patent Document 1: Japanese Unexamined Patent Publication 2009-181922

SUMMARY OF INVENTION

Technical Problem

In sample surface analysis using a scanning electron microscope and an X-ray detector, a sample surface subjected to normal observation is not perfectly flat and many concavities and convexities are present therein. Accordingly, if an obstacle, such as a concave-convex portion resulting from the surface shape and surface roughness of a sample, is present between the X-ray detector and an analysis position in the sample surface, a characteristic X-ray generated at the analysis position is blocked by the concave-convex portion, thereby causing a spectral intensity acquired by the X-ray detector to be decreased. Additionally, when a large difference is present between the energies of detected spectra (e.g., Al—K and Cu—K), a ratio, at which the spectral intensity on the lower energy side is decreased, becomes large, and hence a different peak intensity ratio is detected.

Thus, if a concave-convex portion is present in an analysis surface, a place shaded, when viewed from the X-ray detector, by the concave-convex portion cannot be accurately analyzed. Additionally, when normal X-ray elemental analysis is performed, an analysis range is determined while a back scattered electron image, from which a composition contrast can be acquired, is being viewed in addition to a secondary electron image acquired by a secondary electron detector, but in a place where a spectral intensity is decreased, it is difficult to distinguish an analysis range from a back scattered electron image (hereinafter, referred to as a top-BSE image for convenience) acquired by a back scattered electron detector (hereinafter, referred to as a top-BSE detector for convenience) disposed directly above a sample surface. When X-ray elemental analysis is performed in such a way, an analyst currently determines an analysis range by assuming the concave-convex shape of a sample surface from a secondary electron image acquired by a secondary electron detector, the image including shape information, and evaluates an acquired analysis result based on experience. If an X-ray is not detected due to concavities and convexities in the analysis range, or if there is a portion where it is determined that analysis data may be affected by a decrease in an X-ray intensity, it is required to retake data by readjusting the positional relationship between the sample and the X-ray detector (so-called reworking). When the positional relationship between the sample and the X-ray detector cannot be readjusted, there is only a way remaining, in which the acquired analysis result is discussed, taking into consideration a concavo-convex state in the sample surface from the acquired analysis data, and hence accurate data interpretation cannot be performed in some cases.

An object of the present invention is to provide a charged-particle radiation apparatus capable of evaluating and distinguishing an analysis position in a sample, which is suitable for X-ray analysis, in the stage before X-ray elemental analysis is performed, and also making it possible for an analyst to perform, in a short period of time and without reworking, analysis for which high reliability is ensured.

Solution to Problem

An embodiment for achieving the aforementioned object is a charged-particle radiation apparatus provided with an X-ray detector, in which: a first back scattered electron detector is disposed on the same axis as an X-ray detection surface of the X-ray detector and disposed integrally with or independently from the X-ray detector; and the charged-particle radiation apparatus has a function of detecting, simultaneously with or separately from each other, an X-ray signal by the X-ray detector and a back scattered electron signal by the first back scattered electron detector.

Another embodiment is a charged-particle radiation apparatus provided with an X-ray detector, in which: a first back scattered electron detector is disposed at a position non-coaxial with an X-ray detection surface of the X-ray detector and disposed integrally with or independently from the X-ray detector; and the charged-particle radiation apparatus has a function of detecting, simultaneously with or separately from each other, an X-ray signal by the X-ray detector and a back scattered electron signal by the first back scattered electron detector.

Still another embodiment is a charged-particle radiation apparatus provided with an X-ray detector having a mechanism for inserting a first back scattered electron detector, disposed around the X-ray detector, in front of and on an X-ray optical axis of an X-ray detection surface of the X-ray detector or for retracting a first back scattered electron detector, disposed in front of and on an X-ray optical axis of an X-ray detection surface of the X-ray detector, to the circumference of the X-ray detector, and also having a function of detecting, simultaneously with or separately from each other, an X-ray signal by the X-ray detector and a back scattered electron signal by the first back scattered electron detector.

Herein, "a first back scattered electron detector is disposed on the same axis as an X-ray detection surface of the X-ray detector" means that the first back scattered electron detector is disposed such that an X-ray optical axis, passing through both the center of the X-ray detection surface of the X-ray detector and an analysis point in a sample, is superimposed on an optical axis of a back scattered electron, passing through both the center of the detection surface of the first back scattered electron detector and the analysis point in the sample.

Additionally, "a first back scattered electron detector is disposed at a position non-coaxially with the detection surface of the X-ray detector" means that the first back scattered electron detector is: disposed such that an X-ray optical axis, passing through both the center of the X-ray detection surface of the X-ray detector and an analysis point in a sample, is not superimposed on an optical axis of a back scattered electron, passing through both the center of the detection surface of the first back scattered electron detector and the analysis point in the sample; and preferably disposed such that the optical axis of the back scattered electron is located at a position occupying part of a region surrounding the X-ray optical axis.

Advantageous Effects of the Invention

According to the present invention, a charged-particle radiation apparatus can be provided, the apparatus being capable of evaluating and distinguishing an analysis position in a sample, which is suitable for X-ray elemental analysis, by using information on the surface of the sample viewed from the side of an X-ray detector, the information being acquired by a first back scattered electron detector, in the stage before X-ray elemental analysis is performed, and also making it possible for an analyst to perform, in a short period of time and without reworking, analysis for which high reliability is ensured.

BRIEF DESCRIPTION OF THE DRAWINGS

FIG. 3A is a schematic disposition view of the Coax-BSE detector and a top-BSE detector in the scanning electron microscope illustrated in FIG. 1;

FIG. 3B is examples of sample images respectively acquired by the Coax-BSE detector and the top-BSE detector;

FIGS. 4A and 4B are schematic views illustrating a range within which a back scattered electron detector in the scanning electron microscope illustrated in FIG. 1 is disposed: in which
FIG. 4A is a schematic plan view; and
FIG. 4B is a schematic side view;

FIGS. 10A and 10B are schematic views illustrating moving situations of the Coax-BSE detector in the charged-particle radiation apparatus (scanning electron microscope) according to Fourth Embodiment, in which:
FIG. 10A illustrates the case of the Coax-BSE detector illustrated in FIG. 8; and
FIG. 10B illustrates the case of the Coax-BSE detector illustrated in FIG. 9;

FIG. 11 is a schematic view illustrating another example of the mechanism for moving the Coax-BSE detector in the charged-particle radiation apparatus (scanning electron microscope) according to Fourth Embodiment;

FIGS. 14A and 14B are views for explaining the process flow in FIG. 13: in which
FIG. 14A illustrates a Coax-BSE image; and
FIG. 14B illustrates an image in which the Coax-BSE image illustrated in FIG. 14A is divided into pixels;

FIGS. 15A and 15B illustrate dialog boxes displayed when an analyzable position and a non-analyzable position are distinguished: in which
FIG. 15A illustrates a dialog box displayed when a threshold value for contrast is set; and
FIG. 15B illustrates a dialog box displayed when the contrast and the division number of an image are set;

FIG. 16 is a schematic process flow for distinguishing whether an observation position can be analyzed;

FIGS. 17A to 17D are views for explaining the process flow in FIG. 16: in which
FIG. 17A illustrates a top-BSE image;
FIG. 17B illustrates a Coax-BSE image;
FIG. 17C illustrates an image in which the top-BSE image illustrated in FIG. 17A is divided into pixels; and
FIG. 17D illustrates an image in which the Coax-BSE image illustrated in FIG. 17B is divided into pixels;

FIGS. 18A and 18B are views for explaining the calculation of similarity in the process flow in FIG. 16: in which
FIG. 18A illustrates a minimal region for the distinction in the top-BSE image; and
FIG. 18B illustrates a minimal region for the distinction in the Coax-BSE image;

FIGS. 20A to 20C illustrate a method of displaying an analyzable position and a non-analyzable position on an image display terminal: in which
FIG. 20A illustrates examples in which each pixel unit is distinguished in Fifth Embodiment;
FIG. 20B illustrates examples in which each divided region is distinguished in Sixth Embodiment;
and
FIG. 20C illustrates an example of displaying whether a selected divided region can be analyzed.

BEST MODE FOR CARRYING OUT THE INVENTION

Figure 1:
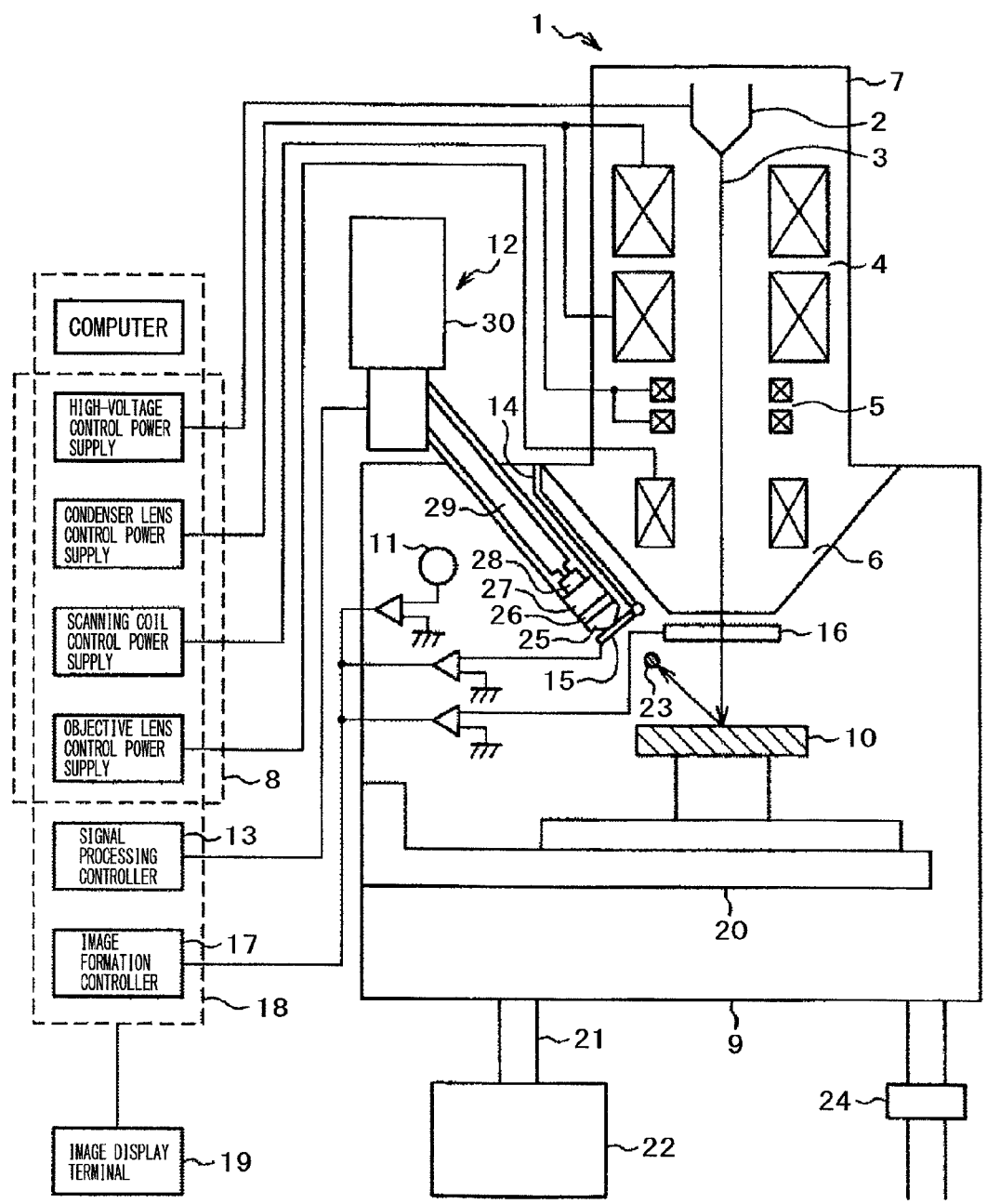
FIG. 1 is a schematic view illustrating an entire configuration of a charged-particle radiation apparatus (scanning electron microscope) according to First Embodiment.

In order to perform accurate X-ray elemental analysis, it is necessary to pinpoint a place where right data can be acquired by specifying a place where an X-ray is blocked by a concave-convex portion, i.e., a place that cannot be viewed from an X-ray detector. So, the present inventors have investigated various ways to pinpoint a place in a sample where right data can be acquired, and invented a method of acquiring a back scattered electron image viewed from an X-ray detector (hereinafter, the image being referred to as a Coax-BSE image for convenience, wherein Coax is an abbreviation of Coaxial according to ANSI) by installing a back scattered electron detector (hereinafter, referred to as a Coax-BSE detector for convenience) on the same axis as the X-ray detector. In the present embodiment, an analyst can perform, in a short period of time and without reworking, X-ray elemental analysis for which high reliability is ensured, by utilizing shape information on the surface of a sample viewed from the side of an X-ray detector, the shape information being acquired with a Coax-BSE detector, or by utilizing the above information in combination with information on a back scattered electron acquired with a top-BSE detector, in the stage before the X-ray elemental analysis is performed, so that the reliability of an analysis result is presented to the analyst. Because a back scattered electron has a high energy and a high straight-advancing property similarly to an X-ray, a back scattered electron signal is blocked if a concave-convex portion is present between a Coax-BSE detector and the shape of a sample surface, thereby causing a signal amount to be decreased. Thus, there is a correlation between an amount of back scattered electron signals in a Coax-BSE image and that of X-ray signals, and hence the amount of X-ray signals can be estimated by viewing a Coax-BSE image. That is, a place whose image is bright in a Coax-BSE image has a large amount of X-ray signals, while a place whose image is dark has a small amount thereof. An analyst can visually understand an efficiency of detecting an X-ray by acquiring a Coax-BSE image in advance, and accordingly can select a place where accurate analysis can be performed (a place where data, which are not affected by concavities and convexities and by which right X-ray peak intensities can be compared together, can be acquired.) Further, by performing image analysis with the use of a Coax-BSE image alone or in combination with a top-BSE image, it becomes possible to automatically evaluate an efficiency of detecting an X-ray in an observation field of view and to automatically distinguish whether the field of view is suitable for the analysis. Although a coaxial configuration has been described above, it is enough for a BSE detector to be installed near an X-ray detector and it is not always required to be installed on the same axis as the X-ray detector. The BSE detector and the X-ray detector can be integrated with or separated from each other. Herein, the Coax-BSE detector is referred to as a first back scattered electron detector and the top-BSE detector as a second back scattered electron detector, for convenience.

Hereinafter, detailed description will be made by using preferred embodiments.

First Embodiment

First Embodiment of the present invention will be described with reference to FIGS. 1 to 4B. FIG. 1 is a schematic view illustrating an entire configuration of a scanning electron microscope that is a charged-particle radiation apparatus according to the present embodiment. The scanning electron microscope 1 illustrated in FIG. 1 includes: an electron source 2; a condenser lens 4 that converges a primary electron beam 3 emitted from the electron source 2; a deflection coil 5 that scans the primary electron beam 3; an electron optical system 7 including an objective lens 6 for focusing the primary electron beam 3; an electron optical system controller 8 that controls conditions of the electron optical system 7; a specimen chamber 9; a secondary electron detector 11 that detects a secondary electron generated from a sample 10 by irradiating the primary electron beam 3 onto the sample 10 as an object to be detected; an energy dispersive X-ray detector 12 that detects a characteristic X-ray; a signal processing controller 13 that performs analysis by processing a signal outputted from the X-ray detector 12; a Coax-BSE detector 15 that detects a back scattered electron, which is fixed to an arm 14 hung from the specimen chamber 9; a top-BSE detector 16 disposed on the lower surface of the objective lens 6; an image formation controller 17 that forms an image by processing image signals outputted from the secondary electron detector 11, the Coax-BSE detector 15, and the top-BSE detector 16; an image display terminal 19 as a display unit connected to a SEM entire controller 18; and a specimen stage 20 that can be operated in five axis directions including two horizontal directions, rotational direction, inclined direction, and vertical direction, and that can grasp information on the position of the sample 10, and the scanning electron microscope 1 is formed by a vacuum pump 22 connected to the specimen chamber 9 via a vacuum pipe 21, and the like. Herein, the same reference numerals represent the same constituent components. Although it has been described above that the controllers, including the electron optical system controller 8, the signal processing controller 13, the image formation controller 17, and the SEM entire controller 18, are formed individually from each other, these controllers may be formed as one controller.

The electron source 2 generally emits the primary electron beam 3 of 0.3 kV to 30 kV. The primary electron beam 3 is converged by the condenser lenses 4 and the objective lenses 6, which are disposed in a plurality of stages, to form an image on the sample 10 to be observed. The deflection coil 5 makes a position in the sample 10, onto which the primary electron beam 3 is irradiated, to be scanned along a desired observation range. A secondary electron, the back scattered electron 23, a characteristic X-ray, and the like, are radiated from the sample 10 by the irradiation of the primary electron beam 3.

The degree of vacuum in the specimen chamber 9 is maintained to be high by the vacuum pump 22 connected to the specimen chamber 9 via the vacuum pipe 21. Additionally, the degree of vacuum therein can be reduced by opening and closing a needle valve 24 provided in an inlet for introducing air into the specimen chamber 9. A secondary electron generated from the sample 10 is detected by the secondary electron detector 11. The secondary electron detector 11 is normally formed by a scintillator and a photomultiplier tube, which are called an Everhart-Thornley type detector.

The X-ray detector 12 is normally provided with a semiconductor detector 27. This detector is an Si(Li+) detector 27 in which an acceptor is neutralized by diffusing L+ ions into a p-type single crystal Si to form an intrinsic layer having no charge. The Si(Li+) detector 27 and an amplifier 28 are thermally connected to a Dewar vessel 30 through a cold finger 29, and are cooled by the liquid nitrogen held in the Dewar vessel 30. When a characteristic X-ray enters the intrinsic layer in the Si(Li+) detector 27 through a collimator 25 and a window 26, an electron-hole pair is generated proportionally to the energy of the characteristic X-ray, which becomes a signal current. After being electrically amplified by the amplifier 28, the acquired signal current is inputted into a pulse-height analyzer, so that it becomes an X-ray spectrum to be outputted. Although it has been described that the X-ray detector 12 of the present embodiment is one provided with the Si(Li+) detector 27, it may be the X-ray detector 12 provided with a Silicon Drift Detector.

Figure 2:
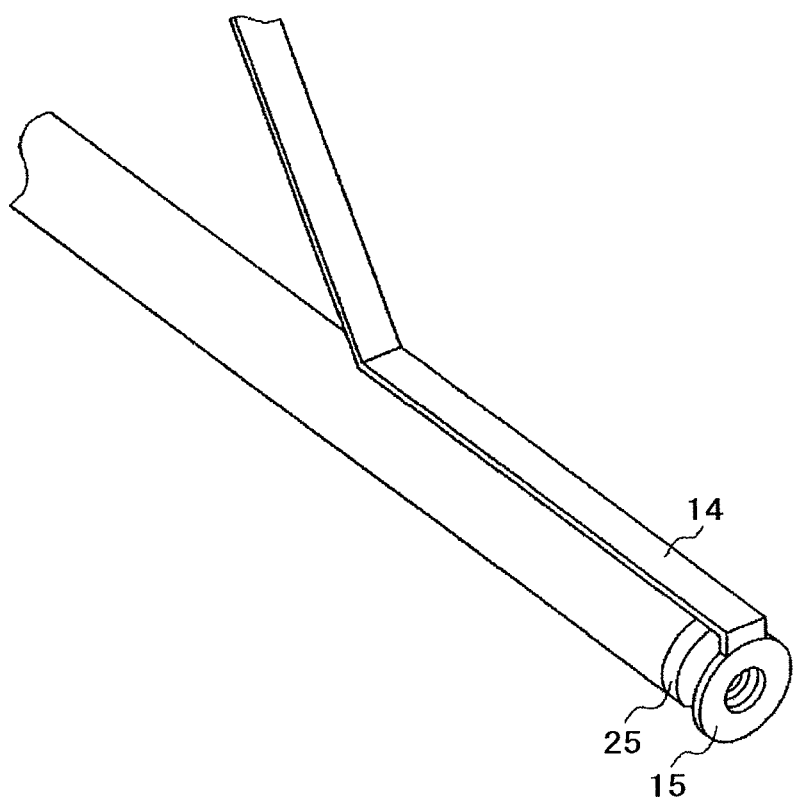
FIG. 2 is a schematic perspective view illustrating a Coax-BSE detector in the scanning electron microscope illustrated in FIG. 1.

The back scattered electron 23 is detected by the top-BSE detector 16 and the Coax-BSE detector 15. A semiconductor detector is usually used in each of these back scattered electron detectors. The top-BSE detector 16 is radially divided into four elements in the present embodiment to acquire concavo-convex information with directivity by detecting back scattered electrons generated from the sample 10 with the each element and by adding and subtracting the detected back scattered electrons. As illustrated in FIG. 2, a hole is provided at the center of the Coax-BSE detector 15 such that a structure is formed, in which the space between the collimator 25 disposed at the tip of the X-ray detector 12 and the analysis position in the sample 10 is not blocked. The Coax-BSE detector 15 is disposed on the same axis as the X-ray detection surface of the X-ray detector 12. Additionally, the Coax-BSE detector 15 is fixed to the inside of the specimen chamber 9 by the arm 14 such that the Coax-BSE detector 15 is disposed independently from the X-ray detector 12. A characteristic X-ray from the sample 10 enters from the collimator 25 in the X-ray detector 12 through the hole at the center of the Coax-BSE detector 15, and hence X-ray elemental analysis can be performed without retracting the Coax-BSE detector 15.

FIGS. 3A and 3B illustrate both the positional relationship between the top-BSE detector 16 and the Coax-BSE detector 15 and an example of an acquired back scattered electron image. As illustrated in FIG. 3A, the Coax-BSE detector 15 is disposed at a certain angle with respect to the surface of the sample 10, and hence an acquired Coax-BSE image is a back scattered electron image having a contrast different from that of a top-BSE image. FIG. 3B illustrates examples of images acquired from the respective detectors. When there is a convex portion in the sample 10, the portion is observed, in a top-BSE image, as an image in which a surface structure around the convex portion is viewed from above. On the other hand, in a Coax-BSE image, the back scattered electron 23 emitted from the side opposite to the convex portion, when viewed from the Coax-BSE detector 15, is blocked by the convex portion because a back scattered electron has a high energy and a high straight-advancing property, and hence information on the circumference of the convex portion cannot be acquired. Similarly, an X-ray also has a high energy and a high straight-advancing property, and hence information on X-rays cannot be acquired from a place that is not viewed from the X-ray detector 12, in particular, from the collimator 25 at the tip portion thereof, similarly to the case of the back scattered electron 23. Such a phenomenon arises also in an inclined surface of a concave portion near to the Coax-BSE detector 15, which greatly affects analysis data similarly to a convex portion. A Coax-BSE image is acquired by using this phenomenon in the stage before X-ray analysis is performed, which is displayed on the image display terminal 19 in combination with a secondary electron image or a top-BSE image. From the image, an analyst can determine a position, where a contrast is high, that is, an X-ray generated from the sample 10 is properly acquired, to be an analysis position. Conversely, the analyst can understand that a place having a low brightness is not suitable for X-ray analysis in the stage before the analysis is performed, and hence the analyst can perform, in a short period of time and without reworking, analysis for which high reliability is ensured.

A characteristic X-ray and a back scattered electron, which have been generated from the same place, can be detected by disposing the X-ray detector 12 and the Coax-BSE detector 15 on the same axis as each other. Thus, a place, where a concave-convex surface can be visually observed in a Coax-BSE image, and a place, where X-ray elemental analysis can be performed, are matched each other, and hence a position in the sample, which is suitable for X-ray analysis, can be accurately distinguished from the Coax-BSE image. Automatic distinction of an analysis place can be performed further accurately by using a Coax-BSE image acquired with the Coax-BSE detector 15 disposed on the same axis as the X-ray detector 12.

Figure 4A:
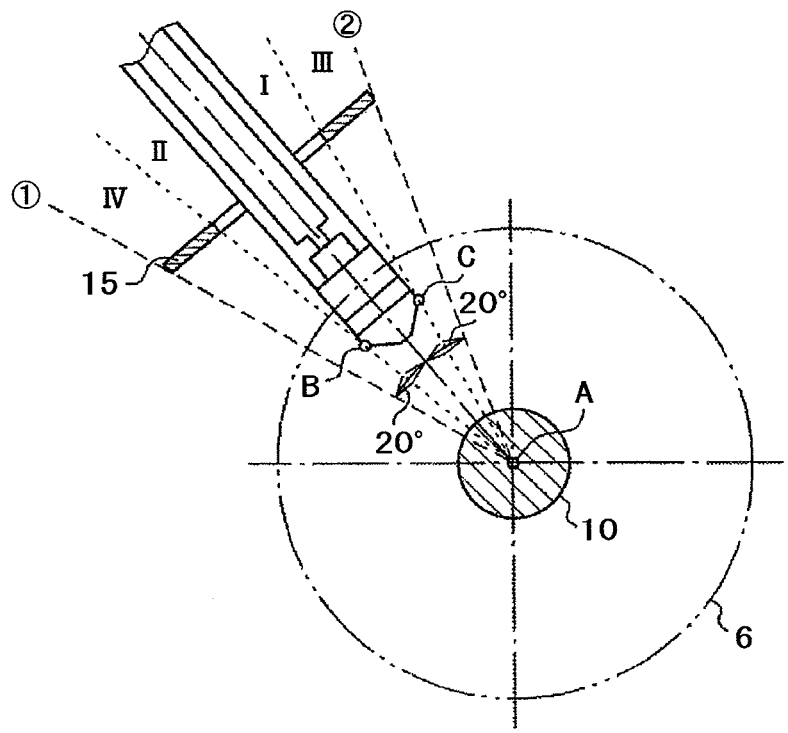
Figure 4B:
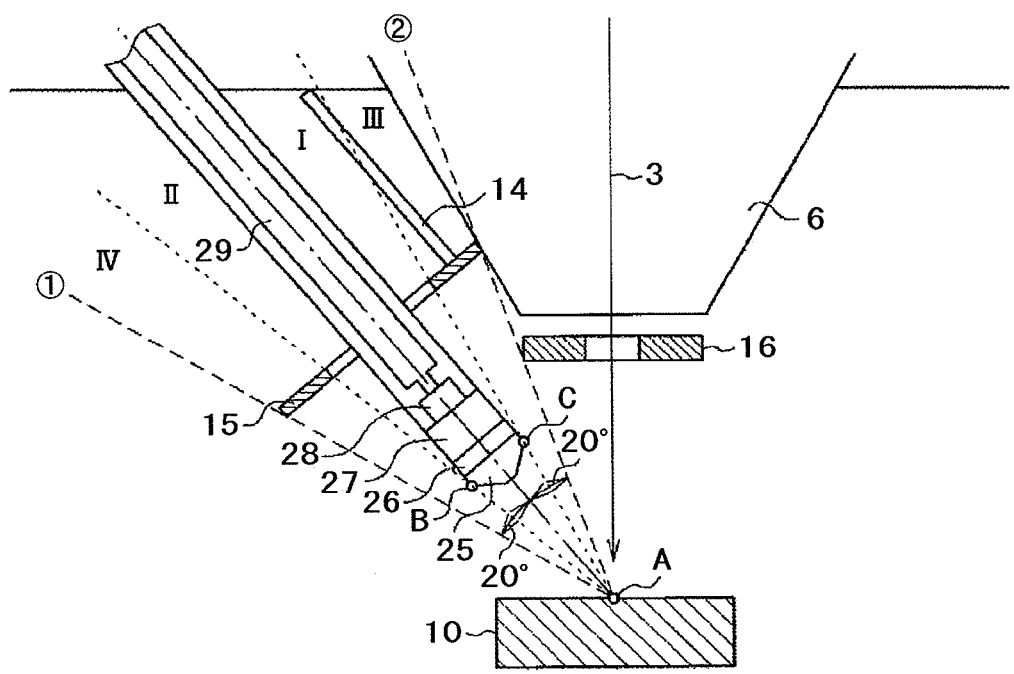

Alternatively, the Coax-BSE detector 15 may be disposed behind the detection surface at the tip of the X-ray detector 12 in the present configuration. FIGS. 4A and 4B illustrate an example in which the Coax-BSE detector 15 is disposed. The Coax-BSE detector 15 has a shape in which a hole is provided at the center thereof such that the X-ray detector 12 penetrates therethrough. The detection surface of the Coax-BSE detector 15 may be located outside the boundaries that are extended lines of the tangent lines connecting an analysis point A and outer circumferential points B and C of the outer frame at the tip of the X-ray detector 12. If the detection surface is disposed in regions I and II inside the boundaries, a back scattered electron generated from the analysis point A is blocked by the X-ray detector 12, and hence it becomes impossible to distinguish an analysis position from a Coax-BSE image. The Coax-BSE detector 15 of the present embodiment can be applied to a scanning electron microscope provided with the energy dispersive X-ray detector 12 as well as to a scanning electron microscope provided with a wavelength dispersive X-ray spectrometer or apparatuses similar thereto.

When a sample surface having concavities and convexities was subjected to X-ray analysis by using a scanning electron microscope according to the present embodiment, good analysis results having good reproducibility were acquired. As described above, a charged-particle radiation apparatus can be provided according to the present embodiment, the apparatus being capable of evaluating and distinguishing an analysis position in a sample, which is suitable for X-ray analysis, in the stage before X-ray elemental analysis is performed, and also making it possible for an analyst to perform, in a short period of time and without reworking, analysis for which high reliability is ensured.

Second Embodiment

Figure 5A:
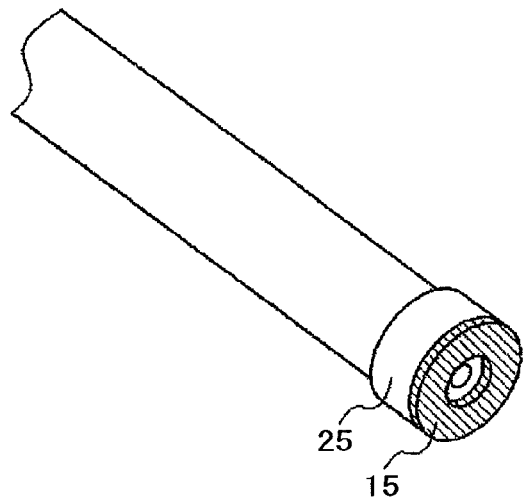
FIG. 5A is a schematic perspective view of a Coax-BSE detector in a charged-particle radiation apparatus (scanning electron microscope) according to Second Embodiment.
Figure 5B:
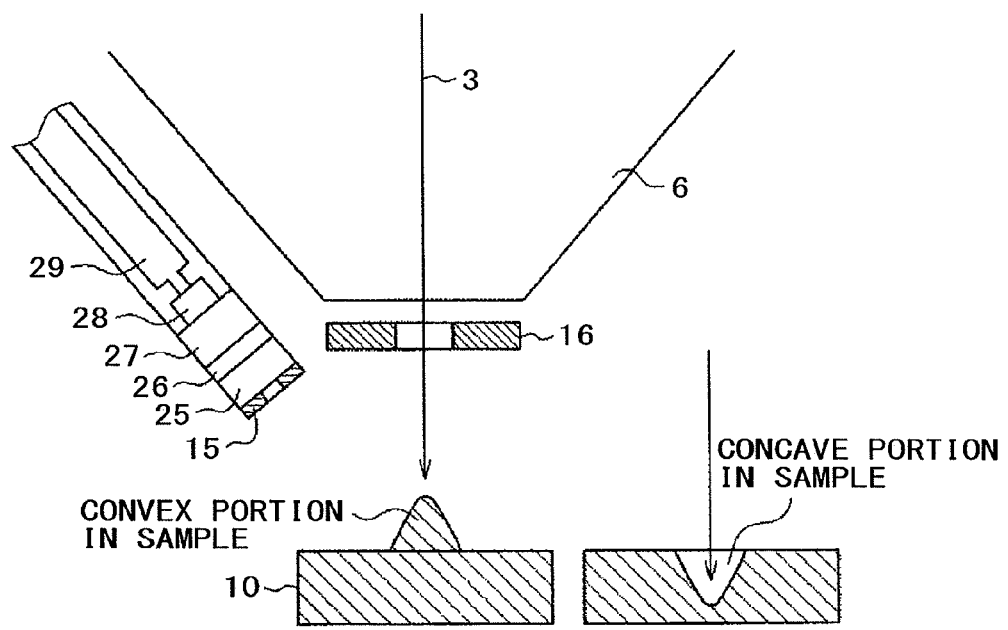
FIG. 5B is a schematic disposition view of the Coax-BSE detector and a top-BSE detector.

Second Embodiment will be described with reference to FIGS. 5A and 5B. FIG. 5A is a schematic perspective view of a Coax-BSE detector in a scanning electron microscope that is a charged-particle radiation apparatus according to the present embodiment, and FIG. 5B is a schematic disposition view of the Coax-BSE detector and a top-BSE detector. This configuration is the same as that illustrated in First Embodiment, except that the Coax-BSE detector 15 is fixed to the tip portion of the X-ray detector 12.

The present scanning electron microscope 1 includes a detector in which the X-ray detector 12 and the Coax-BSE detector 15 are integrated with each other. The Coax-BSE detector 15 is disposed on the same axis as the X-ray detection surface of the X-ray detector 12, and fixed to the tip portion of the collimator 25. Because a characteristic X-ray from the sample 10 enters the X-ray detector 12 through both the hole at the center of the Coax-BSE detector 15 and the collimator 25, X-ray elemental analysis can be performed without retracting the Coax-BSE detector 15. In a Coax-BSE image acquired by the Coax-BSE detector 15, a concavo-convex state of the surface of the sample 10 viewed from the X-ray detector 12 is observed. By utilizing the information acquired from this image alone or in combination with a top-BSE image and a secondary electron image, a place suitable for X-ray elemental analysis and a place not suitable can be accurately distinguished when the analysis is performed. Thereby, an analyst can perform, in a short period of time and without reworking, analysis for which higher reliability is ensured.

Further, by disposing the Coax-BSE detector 15 at the tip portion of the X-ray detector 12, a back scattered electron generated from the sample 10 can be detected at a sensitivity higher than the case where the Coax-BSE detector 15 is disposed therebehind. Thereby, the present embodiment can be applied even to the X-ray elemental analyses performed in an environment in which image resolution is poor, such as high magnification, low acceleration, microcurrent, and low vacuum.

Alternatively, the Coax-BSE detector 15 may be disposed behind the detection surface at the tip of the X-ray detector 12 in the present configuration, similarly to First Embodiment. In that case, the Coax-BSE detector 15 may be fixed to the X-ray detector 12 as an integrated type.

As described above, the X-ray detector 12 and the Coax-BSE detector 15 are integrated with each other, and hence it is not required to adjust the positions of both the detectors, thereby allowing analysis to be performed without a complicated operation. Further, both the detectors can be removed from and attached to the specimen chamber 9 as being integrated with each other. Accordingly, both the detectors can be easily mounted in every apparatus, and an analyst can attach both the detectors to an apparatus that has been purchased.

Similarly to First Embodiment, the Coax-BSE detector 15 of the present embodiment can be applied to a scanning electron microscope provided with the energy dispersive X-ray detector 12 as well as to a scanning electron microscope provided with a wavelength dispersive X-ray spectrometer or apparatuses similar thereto.

When a sample surface having concavities and convexities was subjected to X-ray analysis by using a scanning electron microscope according to the present embodiment, good analysis results having good reproducibility were acquired. As described above, the same advantages as those in First Embodiment can be acquired according to the present embodiment. Further, it is not required to adjust the positions of an X-ray detector and a Coax-BSE detector by integrating them with each other, thereby allowing analysis, for which high reliability is ensured, to be easily performed.

Third Embodiment

Figure 6:
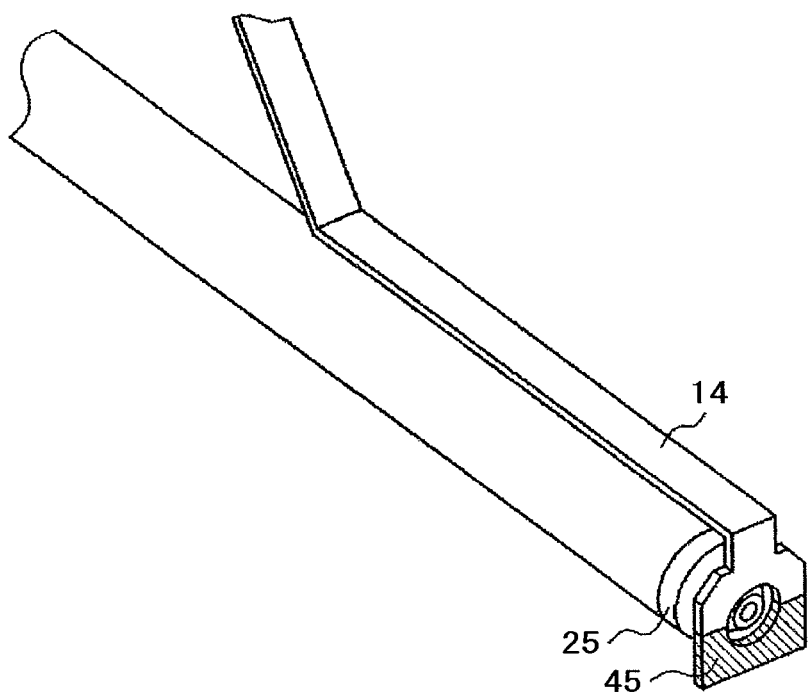
FIG. 6 is a schematic perspective view of a back scattered electron detector disposed at the tip portion of an X-ray detector in a charged-particle radiation apparatus (scanning electron microscope) according to Third Embodiment.
Figure 7:
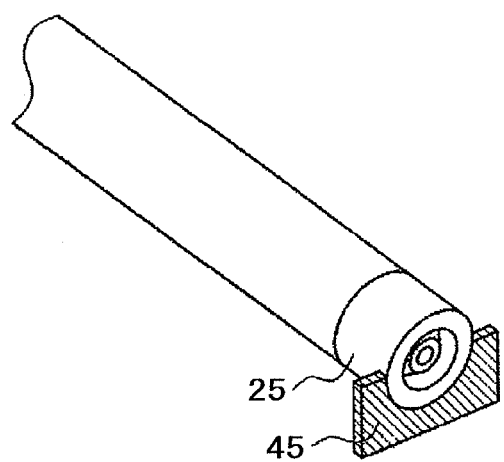
FIG. 7 is a schematic perspective view of another back scattered electron detector disposed at the tip portion of the X-ray detector in the charged-particle radiation apparatus (scanning electron microscope) according to Third Embodiment.

Third Embodiment will be described with reference to FIGS. 6 and 7. FIG. 6 is a schematic perspective view of a back scattered electron detector disposed at the tip portion of an X-ray detector in a scanning electron microscope 1 that is a charged-particle radiation apparatus according to the present embodiment. The shape of a BSE detector 45 is different from those illustrated in FIGS. 2 and 5A, and the central position thereof is not present on the axis of the X-ray detector 12, that is, the axis of the BSE detector 45 is non-coaxial. Herein, the non-coaxial position of the BSE detector is located at a position occupying part of a region surrounding the axis the same as the detection surface of the X-ray detector. The configuration illustrated herein is the same as that illustrated in First Embodiment, except that these axes are non-coaxial.

In the present scanning electron microscope 1, the BSE detector 45 is fixed to the inside of the specimen chamber 9 by the arm 14, and is disposed ahead of and independently from the X-ray detector 12. The BSE detector 45 has a shape by which a characteristic X-ray from the sample 10 is not blocked. Because a characteristic X-ray from the sample 10 enters from the collimator 25 in the X-ray detector 12, X-ray elemental analysis can be performed without retracting the BSE detector 45. In a BSE image acquired by the BSE detector 45, a concavo-convex state of the surface of the sample 10 viewed from a position near the X-ray detector 12 is observed in this case. By utilizing the information acquired from this image alone or in combination with a top-BSE image and a secondary electron image, a place suitable for X-ray elemental analysis and a place not suitable can be distinguished when the analysis is performed. As a result, an analyst can perform, in a short period of time and without reworking, analysis for which high reliability is ensured.

In the present configuration, the central position of the BSE detector 45 is not present on the axis of the X-ray detector. A range within which the BSE detector 45 can be disposed will be described with reference to FIGS. 4A and 4B. The dotted lines (1) and (2) extending from the analysis point A in the sample 10 are inclined by 20° with respect to the axis of the X-ray detector 12, respectively. For example, when the central position of the BSE detector is disposed on the dotted line (1) or (2), an acquired BSE image is greatly different from what is viewed from the X-ray detector 12, and the accuracy in the later-described automatic distinction calculation becomes approximately 50%. Accordingly, the central position of the BSE detector 45 is required to be disposed inside the dotted lines (1) and (2) in order to accurately distinguish an analysis position. When the BSE detector 45 is disposed behind the detection surface at the tip of the X-ray detector 12, the central position of the BSE detector 45 may be disposed in a region III or IV. In other words, the central position of the detection surface of the BSE detector 45 may be disposed: in a conical region, the vertex of which is the analysis point A in the sample 10 and each of the sides of which is formed with the central axis of the detection surface of the X-ray detector 12 being inclined by less than 20°; and further, in an area between the detection surface of the X-ray detector 12 and the analysis point A, or an area outside the boundaries that are extended lines of the tangent lines connecting the analysis point and outer circumferential points of the outer frame at the tip of the X-ray detector 12. Alternatively, the BSE detector 45 may be disposed at a position located, with respect to the sample 10, in the same direction as the direction in which the detection surface of the X-ray detector 12 is disposed, where a back scattered electron, generated in the sample 10 and advancing straight as it is, can be detected.

Herein, "with respect to the sample 10, the same direction as the direction in which the detection surface of the X-ray detector 12 is disposed" means that the central position of the aforementioned BSE detector 45 is disposed inside the dotted lines (1) and (2), and "a position where a back scattered electron, generated in the sample 10 and advancing straight as it is, can be detected" means that the central position of the aforementioned BSE detector 45 is disposed in the region III or IV. Alternatively, the BSE detector 45 may be disposed ahead of the detection surface at the tip of the X-ray detector 12, that is, disposed between the tip of the X-ray detector 12 and the sample. Still alternatively, the BSE detector 45 may be disposed at the tip portion of the X-ray detector 12. Herein, "the BSE detector 45 is disposed at the tip portion of the X-ray detector 12" includes the following four cases: where the BSE detector 45 is disposed directly at the tip of the X-ray detector 12; where the BSE detector 45 is disposed so as to contact a portion near the tip of the X-ray detector 12; where the BSE detector 45 is disposed at the tip of and on the same axis as the X-ray detector 12; and where the central position of the BSE detector 45 is disposed between the tip of the aforementioned X-ray detector 12 and the sample and further in the region III or IV.

The configuration of the present embodiment can also be applied to the case where the BSE detector 45 is integrated with the X-ray detector 12. FIG. 7 illustrates the embodiment. The BSE detector 45 is fixed to the tip portion of the collimator 25. The BSE detector 45 has a shape by which a characteristic X-ray from the sample 10 is not blocked. Because a characteristic X-ray from the sample 10 enters from the collimator 25 in the X-ray detector 12, X-ray elemental analysis can be performed without retracting the BSE detector 45.

The central position of the BSE detector 45 is located at a position having an angle smaller than the angle between the central axis of the X-ray detector 12 and the surface of the sample 10, but may be located at a position having a larger angle. In this case, however, even a place that is not viewed from the X-ray detector 12 may be viewed from the BSE detector 45, and hence the accuracy in distinguishing an analysis position becomes poorer than the case where the central position of the BSE detector 45 is located at a position having a smaller angle.

When the central axis of the Coax-BSE detector 15 is located lower than that of the X-ray detector 12 in such a non-coaxial configuration, an area able to be analyzed can be detected more surely than the case where the central axis of the Coax-BSE detector 15 is located upper than that, and hence the accuracy in the distinction can be improved.

Alternatively, in such a configuration illustrated in FIGS. 5A and 5B, the Coax-BSE detector 15 may be divided into an upper detector and a lower detector. In this case, a non-coaxial configuration can be formed by using only the lower detector, and the same advantages as those in the embodiment in FIG. 7 can be acquired. On the other hand, when both the upper and lower detectors are used, a back scattered electron can be detected at a sensitivity two times larger than that of the case where the lower detector is only used. By dividing the Coax-BSE detector into two detectors as described above, those detectors can be used in accordance with a purpose where importance is placed on distinction or sensitivity.

Similarly to First Embodiment, the Coax-BSE detector 15 of the present embodiment can be applied to a scanning electron microscope provided with the energy dispersive X-ray detector 12 as well as to a scanning electron microscope provided with a wavelength dispersive X-ray spectrometer or apparatuses similar thereto.

When a sample surface having concavities and convexities was subjected to X-ray analysis by using a scanning electron microscope according to the present embodiment, good analysis results having good reproducibility were acquired. As described above, a charged-particle radiation apparatus can be provided according to the present embodiment, the apparatus being capable of evaluating and distinguishing an analysis position in a sample, which is suitable for X-ray analysis, in the stage before X-ray elemental analysis is performed, and also making it possible for an analyst to perform, in a short period of time and without reworking, analysis for which high reliability is ensured.

Fourth Embodiment

Figure 8:
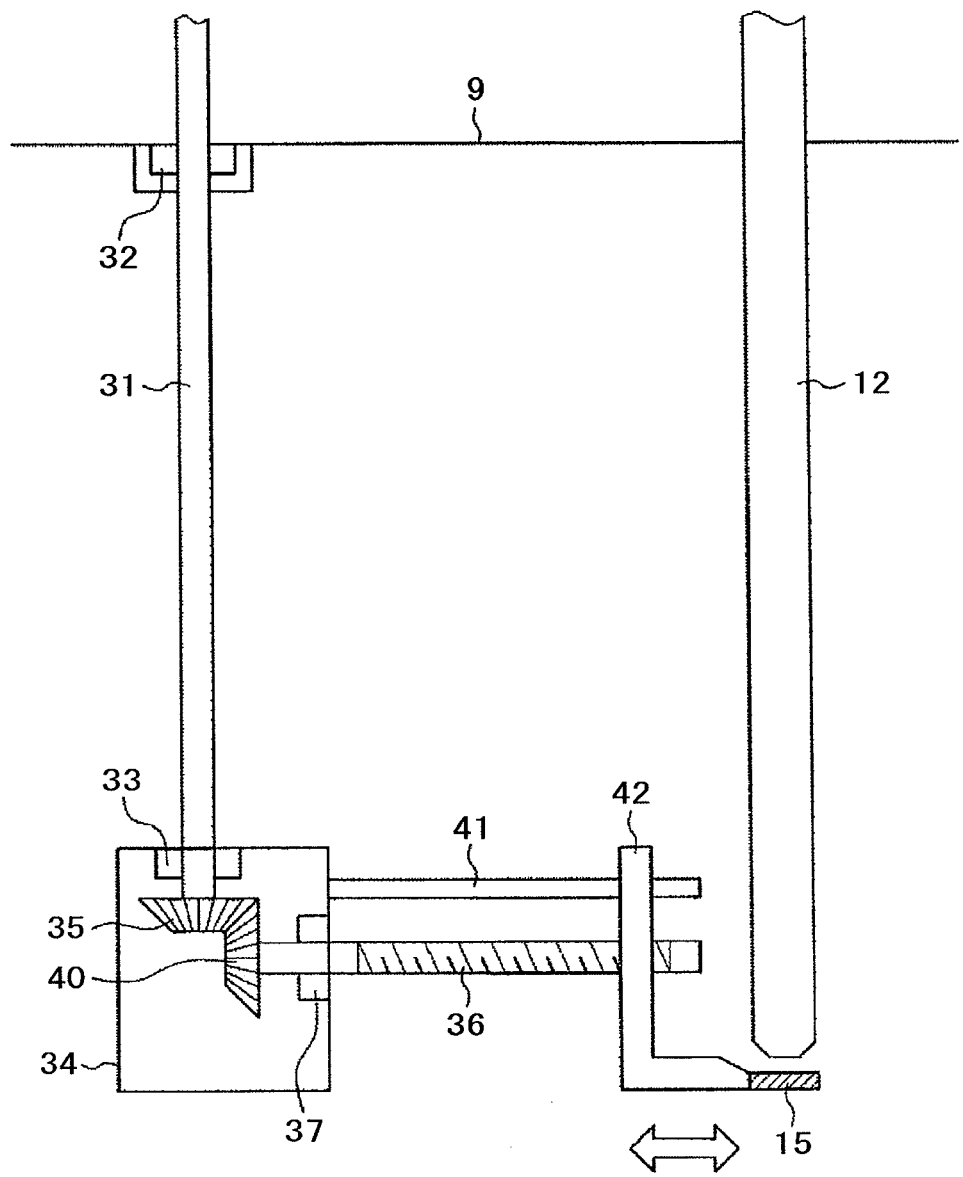
FIG. 8 is a schematic view illustrating an example of a mechanism for moving a Coax-BSE detector in a charged-particle radiation apparatus (scanning electron microscope) according to Fourth Embodiment.

Fourth Embodiment will be described with reference to FIGS. 8 to 12. FIG. 8 is a schematic view illustrating an example of a mechanism for moving a Coax-BSE detector in a scanning electron microscope 1 that is a charged-particle radiation apparatus according to the present embodiment. The configuration in the embodiment is the same as that illustrated in First Embodiment, except that a hole is not provided at the center of the Coax-BSE detector 15, and instead, a mechanism for inserting/retracting the Coax-BSE detector 15 onto or away from the axis of the front surface of the X-ray detector 12 is provided, thereby allowing a back scattered electron image acquired only by a back scattered electron, which has been elastically scattered in a direction toward the X-ray detector 12, i.e., elastically scattered perfectly coaxially with the X-ray detector 12, to be acquired.

Figure 10A:
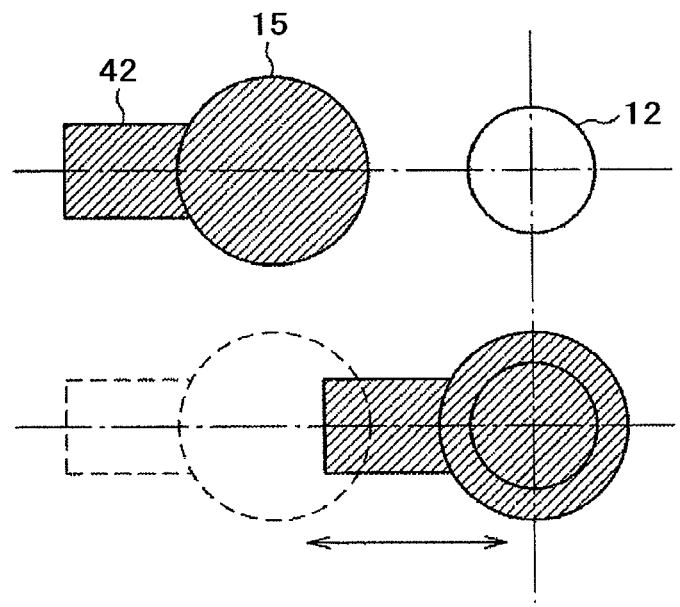

The present scanning electron microscope 1 is provided with a mechanism for inserting or retracting the Coax-BSE detector 15 by sliding it onto the axis in front of the X-ray detector 12. The bidirectional arrows indicate sliding directions. A supporting rod 31 is attached to the specimen chamber 9, and both ends thereof are supported by ball bearings 32 and 33 that are respectively attached to the specimen chamber 9 and a bearing housing 34 supported by an arm attached to the specimen chamber 9. A bevel gear 35 is attached to one end of the supporting rod 31. A feed screw 36 is supported by a ball bearing 37 attached to the bearing housing 34. A bevel gear 40 is attached to one end of the feed screw 36 to be meshed with the bevel gear 35. A guide 41 is fixed to the bearing housing 34. The Coax-BSE detector 15 is fixed to a slider 42 that is attached to the feed screw 36 and the guide 41. With this configuration, it becomes possible to insert/retract the Coax-BSE detector 15 by sliding it onto the axis of the front surface of the X-ray detector 12, as illustrated in FIG. 10A.

Figure 9:
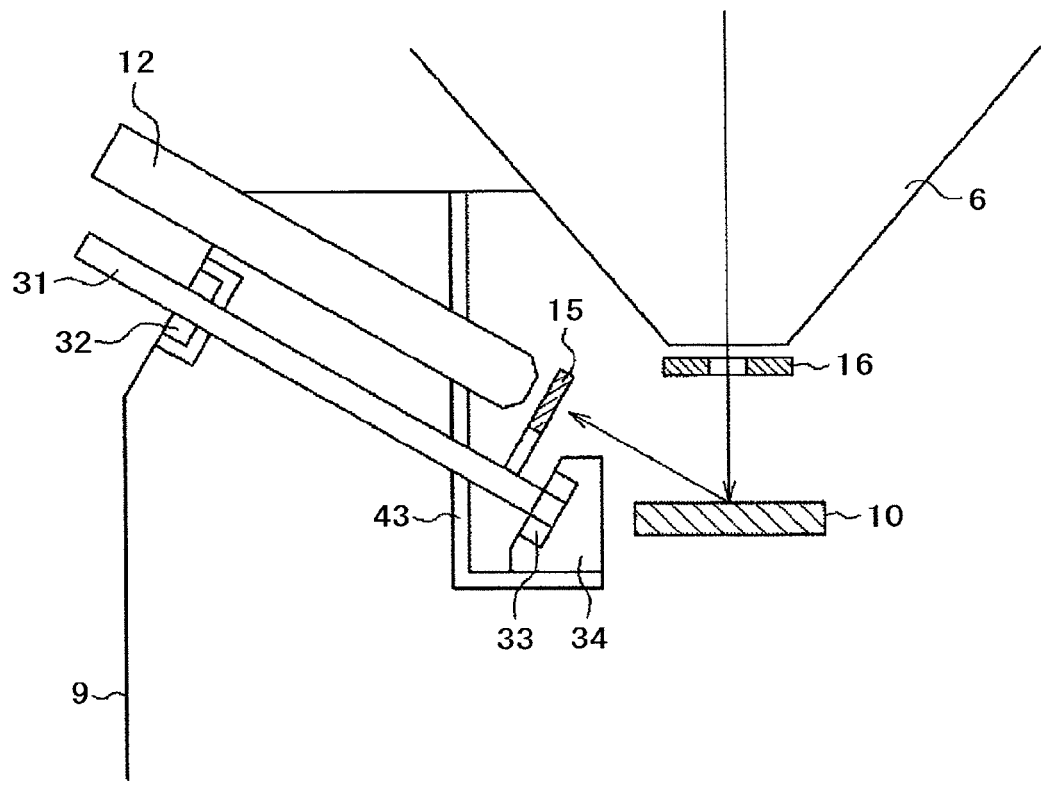
FIG. 9 is a schematic view illustrating another example of the mechanism for moving the Coax-BSE detector in the charged-particle radiation apparatus (scanning electron microscope) according to Fourth Embodiment.
Figure 10B:
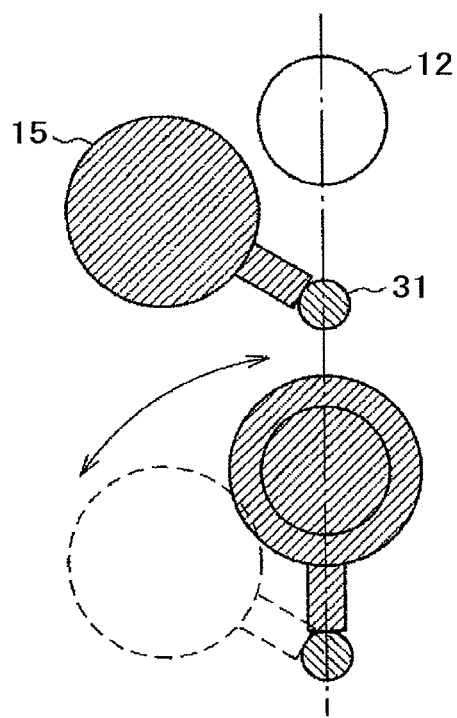

The configuration illustrated in FIG. 9 may also be adopted as a mechanism for inserting/retracting the Coax-BSE detector 15 toward or away from the front surface of the X-ray detector 12. A supporting rod 31 is attached to the specimen chamber 9, and both ends thereof are supported by ball bearings 32 and 33 that are respectively attached to the specimen chamber 9 and a bearing housing 34 supported by an arm 43 fixed to the specimen chamber 9. The Coax-BSE detector 15 is fixed to one end of the supporting rod 31. With this configuration, it becomes possible to make the Coax-BSE detector 15 work as a wiper by rotating the supporting rod 31 as a rotating shaft, as illustrated in FIG. 10B, thereby allowing the Coax-BSE detector 15 to be inserted/retracted onto or away from the axis of the front surface of the X-ray detector 12.

As described above, it becomes possible to insert/retract the Coax-BSE detector 15 onto or away from the axis of the front surface of the X-ray detector 12 by adopting the present configuration. The supporting rod 31 may be rotated by using an electric actuator, etc., disposed inside or outside the specimen chamber 9. A Coax-BSE image acquired by the Coax-BSE detector 15 is obtained by a back scattered electron 23 that has directly entered the collimator 25, unlike a Coax-BSE image obtained by a back scattered electron 23 that has been elastically scattered toward the circumference of the collimator 25, the latter image being acquired when a hole is provided in the Coax-BSE detector 15; and hence, in the former Coax-BSE image, a concavo-convex state of the surface of a sample viewed from the X-ray detector 12, is more accurately observed than the case in First Embodiment. By utilizing information acquired from this image alone or in combination with a top-BSE image and a secondary electron image, a place suitable for X-ray elemental analysis and a place not suitable can be accurately distinguished when the analysis is performed. Thereby, an analyst can perform, in a short period of time and without reworking, analysis for which higher reliability is ensured.

Alternatively, a place suitable for X-ray elemental analysis and a place not suitable may be distinguished when the analysis is performed, by acquiring a back scattered electron image in a state where the Coax-BSE detector 15 is retracted away from the axis of the front surface of the X-ray detector 12 in the present configuration. In this case, the accuracy in distinguishing an analysis position is decreased in comparison with the case where the Coax-BSE detector 15 and the X-ray detector 12 are coaxial with each other; however, efforts for retracting the Coax-BSE detector 15 can be saved when X-ray elemental analysis is performed, and it becomes possible to simultaneously acquire both a back scattered electron signal generated in the direction of the Coax-BSE detector 15 and an X-ray signal generated in the direction of the X-ray detector 12.

Still alternatively, the Coax-BSE detector 15 may have a shape in which a hole is provided at the center of the detector in the present configuration. When the Coax-BSE detector 15 is provided on the axis of the front surface of the X-ray detector, an X-ray enters the X-ray detector after passing through the hole in the Coax-BSE detector 15. Accordingly, efforts for retracting the Coax-BSE detector 15 can be saved when X-ray elemental analysis is performed.

What have been described above can also be applied to the case where the Coax-BSE detector 15 is integrated with the X-ray detector 12. FIG. 11 illustrates an example of a mechanism for inserting/retracting the Coax-BSE detector 15 by sliding it onto the axis in front of the X-ray detector 12. A supporting rod 31 is attached to a flange 44 attached to the specimen chamber 9, and both ends of the supporting rod 31 are supported by ball bearings 32 and 33 that are respectively attached to the flange 44 and a bearing housing 34 fixed to the X-ray detector 12. A bevel gear 35 is attached to one end of the supporting rod 31. Both ends of a feed screw 36 are supported by ball bearings 37 and 38 that are respectively attached to the bearing housing 34 and a bearing housing 39 fixed to the X-ray detector 12. A bevel gear 40 is attached to one end of the feed screw 36 to be meshed with the bevel gear 35. A guide 41 is fixed to the bearing housings 34 and 39. The Coax-BSE detector 15 is fixed to a slider 42 that is attached to the feed screw 36 and the guide 41. With this configuration, it becomes possible to insert/retract the Coax-BSE detector 15 by sliding it onto the axis of the front surface of the X-ray detector 12, as illustrated in FIG. 10A.

Figure 12:
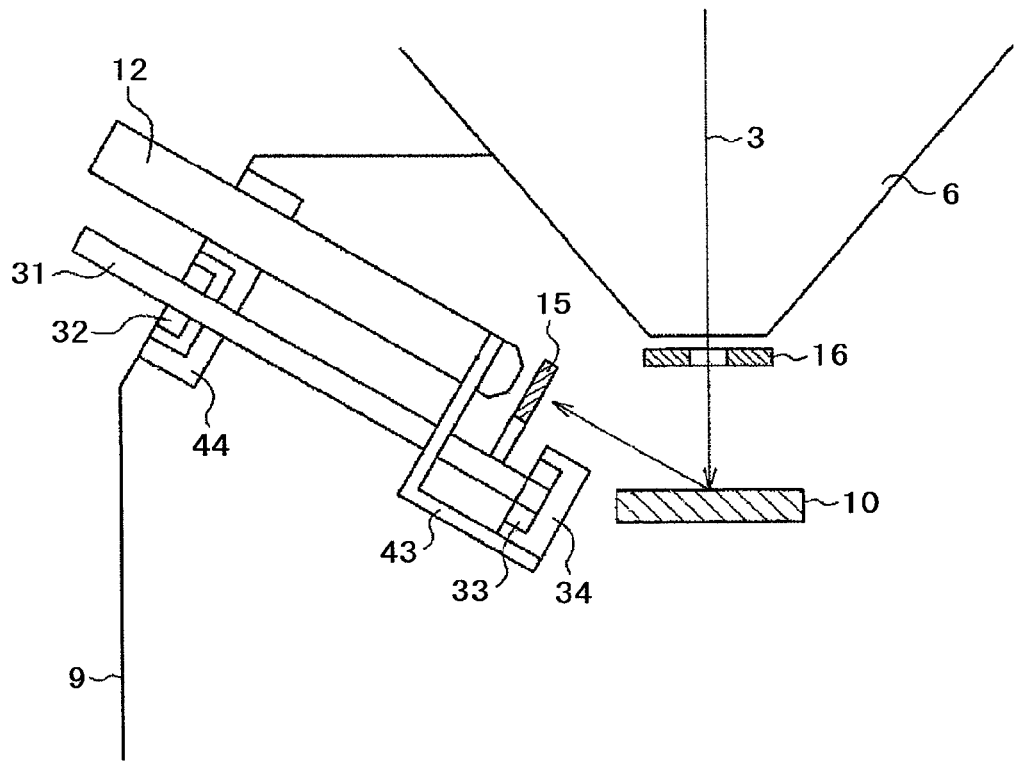
FIG. 12 is a schematic view illustrating still another example of the mechanism for moving the Coax-BSE detector in the charged-particle radiation apparatus (scanning electron microscope) according to Fourth Embodiment.

Alternatively, the configuration illustrated in FIG. 12 may be adopted as a mechanism for the case where the Coax-BSE detector 15 is integrated with the X-ray detector 12. A supporting rod 31 is attached to a flange 44 attached to the specimen chamber 9, and both ends of the supporting rod 31 are supported by ball bearings 32 and 33 that are respectively attached to the flange 44 and a bearing housing 34 supported by an arm 43 that is fixed to the X-ray detector 12. The Coax-BSE detector 15 is fixed to one end of the supporting rod 31. With this configuration, it becomes possible to make the Coax-BSE detector 15 work as a wiper by rotating the supporting rod 31 as a rotating shaft, as illustrated in FIG. 10B, thereby allowing the Coax-BSE detector 15 to be inserted/retracted onto or away from the axis of the front surface of the X-ray detector 12. The positions at which the first back scattered electron detector is disposed have been described in First to Third Embodiments and the present Embodiment. An appropriate analysis position can be distinguished in every configuration, but the accuracies in the distinction are different from each other. When the first back scattered electron detector is disposed on the same axis as and at the tip portion of the X-ray detector 12, shape information on the surface of a sample viewed from the X-ray detector 12 is reflected most sufficiently in an acquired back scattered electron image, and hence an analysis position can be distinguished most accurately. Subsequently, the accuracies in the distinction are decreased in the order of: the case where the first back scattered electron detector is disposed at the tip portion of the X-ray detector 12; and the case where the first back scattered electron detector is disposed in the same direction as that of the X-ray detector 12.

When the X-ray detector 12 and the Coax-BSE detector 15 are integrated with each other, the X-ray detector 12, the Coax-BSE detector 15, and the moving mechanism can be removed or attached as they are integrated together, by removing the flange 44. Accordingly, they can be easily mounted in every apparatus, and an analyst can also attach them to an apparatus that has been purchased. Similarly to First Embodiment, the Coax-BSE detector 15 of the present invention can be applied to a scanning electron microscope provided with the energy dispersive X-ray detector 12 as well as to a scanning electron microscope provided with a wavelength dispersive X-ray spectrometer or apparatuses similar thereto.

In the present configuration, the Coax-BSE detector 15 can be approached closer to the sample 10 than the top-BSE detector 16 can by changing the length of the supporting rod 31 and the shape of the slider 42. Accordingly, a back scattered electron can be observed at a position more advantageous than that of the top-BSE detector 16 under severer conditions such as high magnification, low acceleration, microcurrent, and low vacuum. Additionally, when the X-ray detector 12 is located at an angle of 35° with respect to the sample surface, the sample 10 is also viewed from the Coax-BSE detector 15 located at an angle of 35°, and hence observation, in which the ratio of composition information and concavo-convex information is appropriately changed, can be performed by inclining the sample 10 from which back scattered electrons are scattered all around. Thus, the Coax-BSE detector 15 can not only be applied to X-ray analysis, but also be used as a high-sensitivity back scattered electron detector having characteristics different from those of the top-BSE detector 16.

When a sample surface having concavities and convexities was subjected to X-ray analysis by using a scanning electron microscope according to the present embodiment, good analysis results having good reproducibility were acquired. As described above, a charged-particle radiation apparatus can be provided according to the present embodiment, the apparatus being capable of evaluating and distinguishing an analysis position in a sample, which is suitable for X-ray analysis, in the stage before X-ray elemental analysis is performed, and also making it possible for an analyst to perform, in a short period of time and without reworking, analysis for which high reliability is ensured. Further, by providing a mechanism for inserting/retracting the Coax-BSE detector onto or away from the axis of the front surface of the X-ray detector, it is not necessary to provide a hole at the center of the Coax-BSE detector and it becomes possible to acquire a back scattered electron image by an back scattered electron that has been elastically scattered perfectly coaxially with the X-ray detector, thereby allowing an analysis position, which is more suitable for X-ray analysis, to be evaluated and distinguished.

Fifth Embodiment

Figure 13:
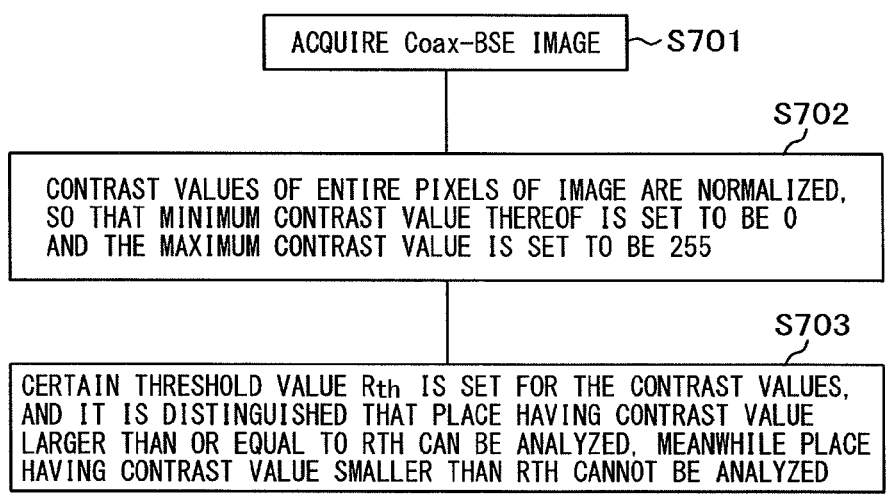
FIG. 13 is a process flow for distinguishing whether an observation position can be analyzed.
Figures 14A, 14B:
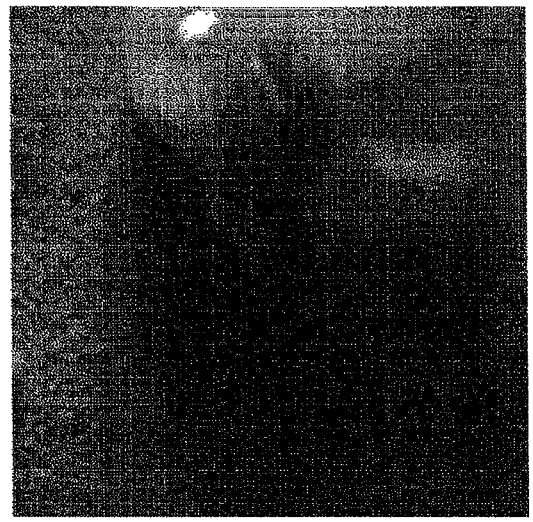
Figure 15A:
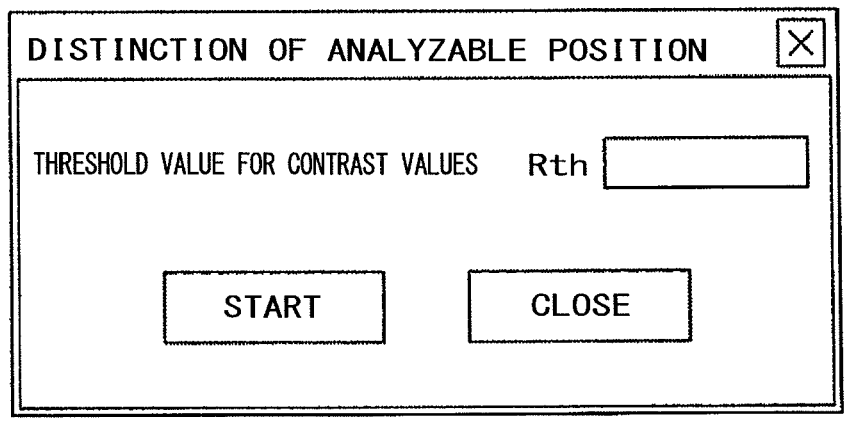
Figure 15B:
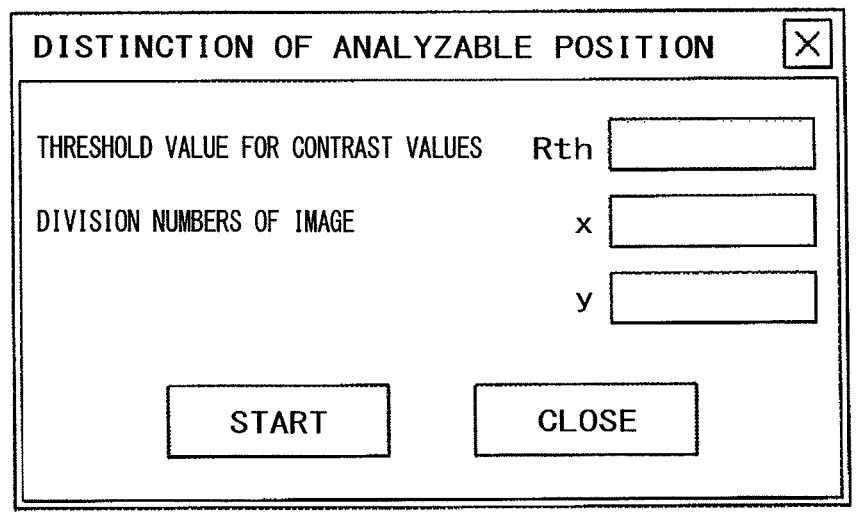

Fifth Embodiment will be described with reference to FIGS. 13 to 15B. In the present embodiment, a method of automatically distinguishing a place having a high efficiency of detecting an X-ray will be described by using the scanning electron microscope illustrated in First Embodiment. Herein, the issues, which have been described in any one of First to Fourth Embodiments and will not be described in the embodiment, can also be applied to the embodiment, unless otherwise indicated. The operations of the scanning electron microscope are controlled by a controller such as, for example, the SEM entire controller 18. In the embodiment, a position, which can be subjected to X-ray elemental analysis, is distinguished by using only the Coax-BSE detector 15, not using the top-BSE detector 16. FIG. 13 is a view illustrating a process flow for acquiring an optimal X-ray analysis position in the embodiment; FIGS. 14A and 14B are views for explaining the process flow in FIG. 13 by using Coax-BSE images actually acquired by the Coax-BSE detector 15; and FIGS. 15A and 15B are views illustrating windows displayed when an analysis position is distinguished.

Step 1 (S701 in FIG. 13):

A Coax-BSE image (FIG. 14A) is acquired by the Coax-BSE detector 15. It is assumed that the numbers of the pixels of the image acquired in this step is m pixels in the horizontal direction and n pixels in the vertical direction, the image being illustrated in FIG. 14B.

Step 2 (S702):

When the Coax-BSE image acquired in Step 1 is quantized, for example, into 8 bits and represented by gray scale images with 256 graduations, the contrast values of the entire pixels are standardized, so that the minimum contrast value thereof is set to be 0 and the maximum contrast value is set to be 255.

Step 3 (S703):

A certain threshold value Rth is set for the contrast values to compare the contrast values standardized in Step 2 with Rth, and it is distinguished that a place, having a standardized contrast value larger than or equal to Rth, is suitable for the analysis while a place, having a standardized contrast value smaller than Rth, is not suitable for the analysis. Because the contrast values are standardized, a default value can be set for Rth; however, an analyst may arbitrarily set a value for Rth by using the window in FIG. 15A.

The process flow in FIG. 13 has been described above. It can be said that: at a place having a larger contrast value acquired in Step (S702), obstacles are fewer between the Coax-BSE detector 15 and the irradiation position on which the electron beam 3 is irradiated; and the irradiation position is oriented toward the Coax-BSE detector 15. The same is true with an X-ray radiated from the irradiation position of the electron beam 3, and from a position having a larger contrast value, a larger amount of X-rays enters the Si(Li+) detector 27 from the collimator 25 in the X-ray detector 12. That is, by setting a place having a large contrast value in a Coax-BSE image to be an X-ray analysis position, it becomes possible to perform, in a short period of time and without reworking, analysis for which high reliability is ensured. The contrast value is evaluated in each pixel unit in the process flow in FIG. 13, but the image may be divided into x regions in the horizontal direction and y regions in the vertical direction to take an average of the contrast values for each divided unit region, so that the average is compared with the threshold value Rth. Thereby, an influence of noise by a pixel level, possibly occurring due to the shimmering or electrical noise of the electron source 2, the local charge in the sample 10, or the like, can be avoided. In this case, a process flow becomes as follows:

Step 1A:

A Coax-BSE image is acquired by the Coax-BSE detector 15. It is assumed that the numbers of pixels of the image acquired in this step is m pixels in the horizontal direction and n pixels in the vertical direction.

Step 2A:

When the Coax-BSE image acquired in Step 1A is quantized, for example, into 8 bits and represented by gray scale images with 256 graduations, the contrast values of the entire pixels are standardized, so that the minimum contrast value thereof is set to be 0 and the maximum contrast value is set to be 255.

Step 3A:

For example, the image is divided into x regions in the horizontal direction and y regions in the vertical direction, and a minimal region for distinction is defined. It is designed that x and y can be arbitrarily set by an analyst with the use of the window in FIG. 15B.

Step 4A:

The average of the contrast values is taken in each region unit defined in STEP 3A, and it is distinguished that a place, having an averaged value larger than or equal to Rth, is suitable for the analysis while a place, having an averaged value smaller than Rth, is not suitable for the analysis. Because the contrast values are standardized, a default value can be set for Rth; however, an analyst may arbitrarily set a value for Rth by using the window in FIG. 15B.

Subsequently, windows, which are displayed on the image display terminal 19 when: a certain threshold value Rth for the contrast values described in the process flow in FIG. 13 is defined; and the distinction of analysis positions is initiated and terminated, will be described with reference to FIGS. 15A and 15B. When distinction of an analyzable position is performed, an analyst first displays the window in FIG. 15A on the image display terminal 19. Subsequently, the analyst inputs the "Threshold Value for Contrast Values" Rth into the box in order to distinguish an analyzable position. For example, "90" is inputted into the box as a default value and this value is normally used, but the analyst may arbitrarily input an integer of 0 to 255. If a value other than the integers is inputted, an error message is displayed. The analyst then presses the "Start" button in FIG. 15A. Thereby, the process flow in FIG. 13 is initiated. When the distinction of an analysis position is terminated to move on normal observation, the analyst presses the "Close" button in FIG. 15A.

When an analyzable position is distinguished by using the process flow of STEP 1A to STEP 4A, the following procedures are performed: An analyst first displays the window in FIG. 15B on the image display terminal 19. Subsequently, the analyst inputs the "Threshold Value for Contrast Values" Rth and the "Division Numbers of Image" x and y into the boxes in order to distinguish an analyzable position. For example, "90" is inputted into the box for Rth as a default value and this value is normally used, but the analyst may arbitrarily input an integer of 0 to 255. x and y are integers that can divide out the numbers of pixels (m, n) of an image, and that are smaller than or equal to (m, n) and larger than or equal to 1, respectively. If a value, other than the values that can be inputted, is inputted into one of the boxes, an error message is displayed. The analyst then presses the "Start" button in FIG. 15B. Thereby, the process flow of STEP 1A to STEP 4A is performed. When the distinction of an analysis position is terminated to move on normal observation, the analyst presses the "Close" button in FIG. 15B.

With the aforementioned process flow, the reliability of an analysis result can be presented to an analyst in the stage before X-ray elemental analysis is performed. As a result, an analyst can perform, in a short period of time and without reworking, analysis for which high reliability is ensured.

When a sample surface having concavities and convexities was subjected to X-ray analysis by using a scanning electron microscope according to the present embodiment, good analysis results having good reproducibility were acquired. As described above, a charged-particle radiation apparatus can be provided according to the present embodiment, the apparatus being capable of automatically evaluating and distinguishing an analysis position in a sample, which is suitable for X-ray analysis, in the stage before X-ray elemental analysis is performed, and also making it possible for an analyst to perform, in a short period of time and without reworking, analysis for which high reliability is ensured.

Sixth Embodiment

Sixth Embodiment will be described with reference to FIGS. 16 to 19. In the present embodiment, a method of automatically distinguishing a place having a high efficiency of detecting an X-ray by using a top-BSE image, a Coax-BSE image, and the scanning electron microscope illustrated in First Embodiment, will be described. Herein, the issues, which have been described in any one of First to Fourth Embodiments and will not be described in the embodiment, can also be applied to the embodiment, unless otherwise indicated. The operations of the scanning electron microscope are controlled by a controller such as, for example, the SEM entire controller 18. FIG. 16 is a view illustrating a process flow for acquiring an optimal X-ray analysis position in the embodiment; FIGS. 17A to 18B are views for explaining the process flow in FIG. 16 by using a top-BSE image and a Coax-BSE image that have been actually acquired with the top-BSE detector 16 and the Coax-BSE detector 15; and FIG. 19 is a view illustrating a window displayed when an analysis position is distinguished.

Step 1 (S101 in FIG. 16):

A top-BSE image (FIG. 17A) is acquired by the top-BSE detector 16. It is assumed that the numbers of the pixels of the image acquired in this step is i pixels in the horizontal direction and j pixels in the vertical direction, the image being illustrated in FIG. 17C.

Step 2 (S102):

A Coax-BSE image (FIG. 17B) is acquired by the Coax-BSE detector 15. The numbers of the pixels of the image acquired in this step is i pixels in the horizontal direction and j pixels in the vertical direction similarly to the top-BSE image, the image being illustrated in FIG. 17D. For example, when the top-BSE image and the Coax-BSE image, which are acquired in STEP 1 (S101) and STEP 2 (S102), are simultaneously acquired, there is no difference between the scanning ranges of the primary electron beam 3, and hence no difference is generated between the positions of pixels. Accordingly, it is not necessary to perform processing for specifying the positions of both the images, such as pattern matching, before the images are compared with each other.

Step 3 (S103):

When the top-BSE image and the Coax-BSE image, which have been acquired, respectively, in STEP 1 (S101) and STEP 2 (S102), are quantized, for example, into 8 bits and represented by gray scale images with 256 graduations, the contrast values of the entire pixels are standardized, so that the minimum contrast value in each image is set to be 0 and the maximum contrast value is set to be 255.

Figure 18A:
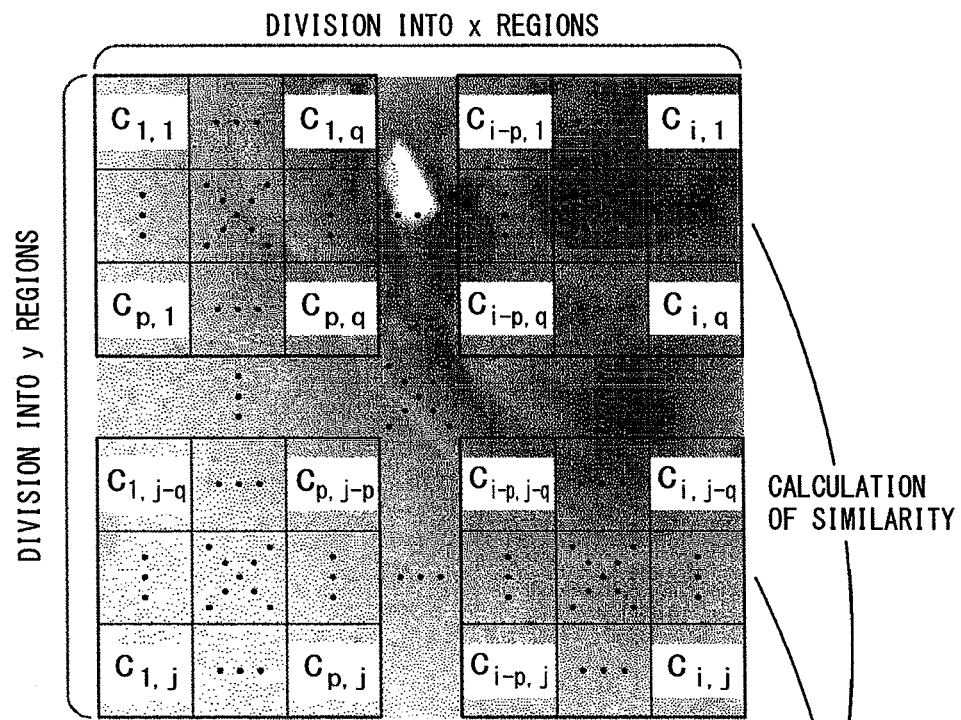
Figure 18B:
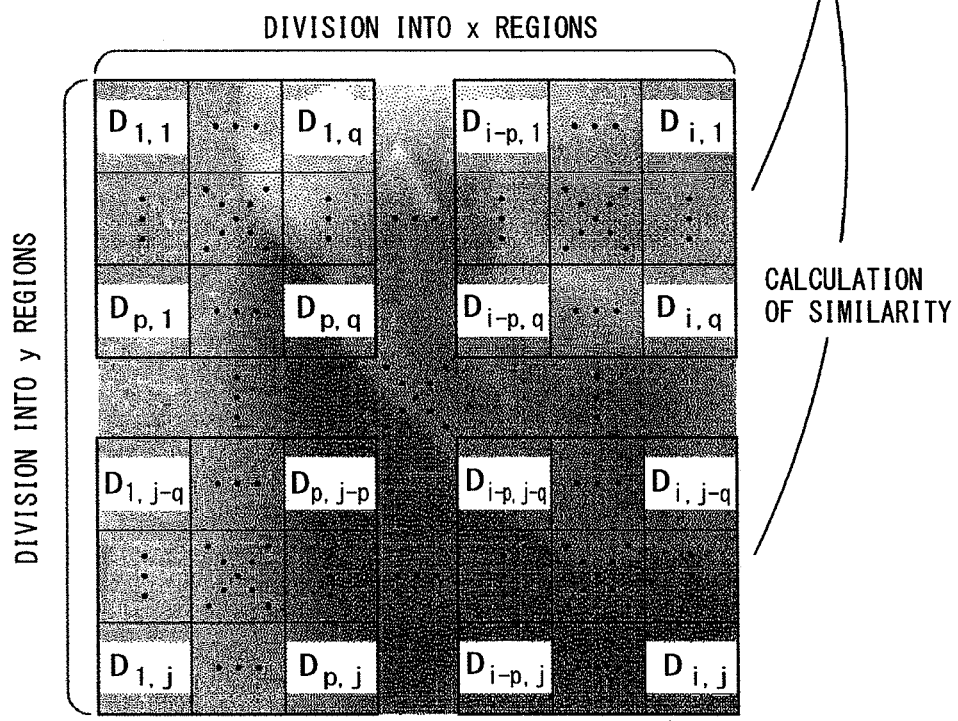
Figure 19:
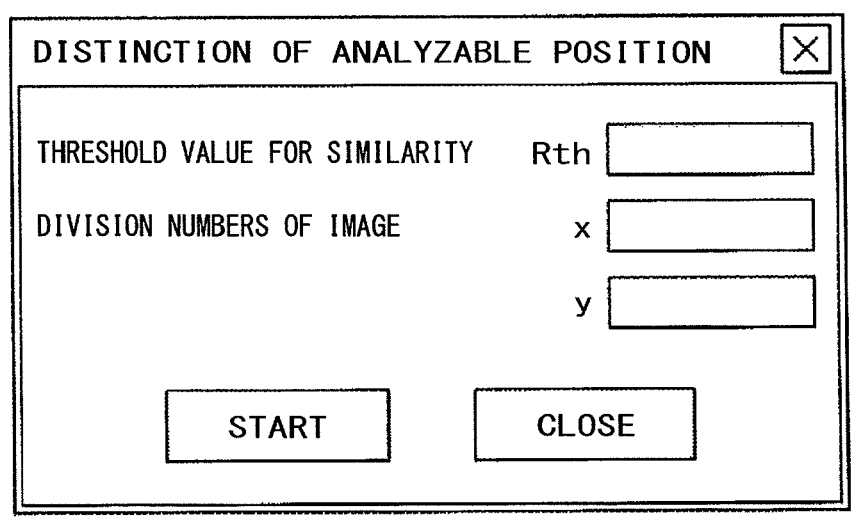
FIG. 19 illustrates a dialog box displayed when an analyzable position and a non-analyzable position are distinguished.

Step 4 (S104):

For example, the image is divided into x regions in the horizontal direction and y regions in the vertical direction, and a minimal region for distinction is defined as illustrated in FIGS. 18A and 18B. It is designed that x and y can be arbitrarily set by an analyst with the use of the window in FIG. 19. Additionally, in the minimal region for distinction, the numbers of pixels in the horizontal direction and the vertical direction are set to be p, and q, respectively.

Step 5 (S105):

Similarity is calculated in each region unit defined in STEP 4 (S104). Methods of calculating similarity include: one using the average of contrast values; one using the correlation value of concentration values for the same pixels; one using similarity comparison of histogram shapes; and the like, and any one of them may be used. Herein, the average of contrast values is used for convenience. The similarity is defined as a ratio of the contrast values in each region unit in each image.

Step 6 (S106):

A certain threshold value Rth is set for the similarity calculated in STEP 5 (S105), and it is distinguished that a place, having a similarity larger than or equal to Rth, is suitable for the analysis while a place, having a similarity smaller than Rth, is not suitable for the analysis. It is designed that Rth can be arbitrarily set, in accordance with the methods of calculating similarity, by an analyst with the use of the window in FIG. 19. For example, when the average of contrast values is used in calculating similarity, Rth is set to be an integer of 0 to 255.

The process flow in FIG. 16 has been described above. By calculating similarity with a combination of the Coax-BSE detector 15 and the top-BSE detector 16 in this way, it becomes possible to distinguish a position suitable for analysis for which higher reliability is ensured. The contrast values are standardized in STEP 3 (S103) in the process flow for the following reason. Because the positions and angles, at which the top-BSE detector 16 and the Coax-BSE detector 15 are disposed, are different from each other in the present embodiment, the amounts of signals acquired by the respective detectors are different from each other. Accordingly, it is necessary to standardize the contrast values in STEP 3 (S103) that is a stage before both the images are compared together, in order that the maximum contrast values and the minimum contrast values in both the images are set to be equal to each other.

Subsequently, the window for inputting the "Threshold Value for Similarity" Rth and the "Division Numbers of Image" x and y, the window being displayed on the image display terminal 19, will be described with reference to FIG. 19. When distinguishing an analyzable position, an analyst first displays the window in FIG. 19 on the image display terminal 19. Subsequently, the analyst inputs the "Threshold Value for Similarity" Rth and the "Division Numbers of Image" x and y into the respective boxes in order to distinguish an analyzable position. A value appropriate in accordance with a method of calculating similarity is inputted for Rth. Integers, which can respectively divide out the pixel numbers (i, j) of the image and which are smaller than or equal to the (i. j) and larger than or equal to 1, are set for x and y, respectively. If a value other than the integers is inputted, an error message is displayed. The analyst then presses the "Start" button in FIG. 19. Thereby, the process flow in FIG. 19 is initiated. When the distinction of an analysis position is terminated to move on normal observation, the analyst presses the "Close" button in FIG. 19

With the aforementioned process flow, the reliability of an analysis result can be presented to an analyst in the stage before X-ray elemental analysis is performed. As a result, an analyst can perform, in a short period of time and without reworking, analysis for which high reliability is ensured.

When a sample surface having concavities and convexities was subjected to X-ray analysis by using a scanning electron microscope according to the present embodiment, good analysis results having good reproducibility were acquired. As described above, a charged-particle radiation apparatus can be provided according to the present embodiment, the apparatus being capable of automatically evaluating and distinguishing an analysis position in a sample, which is suitable for X-ray analysis, in the stage before X-ray elemental analysis is performed, and also making it possible for an analyst to perform, in a short period of time and without reworking, analysis for which high reliability is ensured.

Seventh Embodiment

Seventh Embodiment will be described with reference to FIGS. 20A to 20C. FIGS. 20A to 20C are views illustrating a method of displaying an analyzable position and a non-analyzable position on an image display terminal. In the present embodiment, a method of displaying on the image display terminal, when an appropriate analysis position and an inappropriate analysis position can be distinguished as a result of performing the process flows illustrated in FIGS. 13 and 16 in Fifth Embodiment, will be described. Herein, the issues, which have been described in any one of First to Sixth Embodiments and will not be described in the embodiment, can also applied to the embodiment, unless otherwise indicated.

FIG. 20A illustrate an example in which a result actually acquired from the process flow in FIG. 13 is displayed on a top-BSE image acquired in advance from the same place. A region suitable for analysis and a region not suitable for analysis are distinguished in each pixel unit in a Coax-BSE image after the process flow in FIG. 13. This result is displayed in a secondary electron image, a top-BSE image, or both of them. A display method in which an inappropriate analysis position is indicated, for example, by white color, black color, or the like, can be adopted. In FIG. 20A, an inappropriate analysis position is indicated by black color.

FIG. 20B illustrate an example in which a result actually acquired from the process flow in Sixth Embodiment is displayed in a top-BSE image acquired in advance from the same place. After the process flow in Sixth Embodiment, a secondary electron image, a top-BSE image, or both of them are divided based on the division numbers of image x and y that have been inputted in FIG. 19, in order to display whether each divided region is suitable for analysis. A display method in which an inappropriate analysis position is indicated, for example, by white color, black color, "x" mark, or the like, can be adopted. In FIG. 20B, an inappropriate analysis position is indicated by black color. This display method may also be applied to the case where the process flow of STEP 1A to STEP 4A illustrated in Fifth Embodiment has been performed.

When 1 is inputted into both the boxes for the "Division Numbers of Image" x and y in FIG. 19, the processing, initiated when the "Start" button in FIG. 19 is pressed, is performed for the entire image. In this case, a message, indicating that an analysis can be performed, is displayed on the screen when a position is distinguished to be suitable for analysis as a result of comparing similarity and Rth together; while a message, indicating that an analysis cannot be performed, is displayed on the screen when a position is distinguished not to be suitable for analysis. This display method may also be applied to the case where 1 is inputted into the "Division Numbers of Image" x and y when the process flow of STEP 1A to STEP 4A illustrated in Fifth Embodiment is performed.

Thus, a region in the sample 10, which is suitable for analysis, can be visually understand, and it becomes possible for an analyst to easily perform analysis of an optimal position in an observation field of view, for which analysis accuracy is ensured.

The present invention should not be limited to the aforementioned embodiments and many variations are included. For example, the aforementioned embodiments have been described in detail for understandably explaining the invention and accordingly not always limited to those including all configurations described above. Further, part of a configuration in an embodiment may be replaced with that in another embodiment, or a configuration in an embodiment may be added to that in another embodiment. Furthermore, part of a configuration may be added, cancelled, or replaced with another configuration in each embodiment.

REFERENCE SIGNS LIST

1 Scanning Electron Microscope
2 Electron Source
3 Primary Electron Beam
4 Condenser Lens
5 Deflection Coil
6 Objective Lens
7 Electron Optical System
8 Electron Optical System Controller
9 Specimen Chamber
10 Sample
11 Secondary Electron Detector
12 X-ray Detector
13 Signal Processing Controller
14 Arm
15 Coax-BSE Detector
16 top-BSE Detector
17 Image Formation Controller
18 SEM Entire Controller
19 Image Display Terminal
20 Specimen Stage
21 Vacuum Pipe
22 Vacuum Pump
23 Back Scattered Electron
24 Needle Valve
25 Collimator
26 Window
27 Si(Li+) Detector
28 Amplifier
29 Cold Finger
30 Dewar Vessel
31 Supporting Rod
32, 33 Ball Bearing
34 Bearing Housing
35 Bevel Gear
36 Feed Screw
37, 38 Ball Bearing
39 Bearing Housing
40 Bevel Gear
41 Guide
42 Slider
43 Arm
44 Flange
45 BSE Detector

The invention claimed is:
1. A charged particle radiation apparatus provided with an X-ray detector,
wherein a first back scattered electron detector is disposed at a tip portion of the X-ray detector and on the same axis as an X-ray detection surface of the X-ray detector, and disposed integrally with or independently from the X-ray detector, and wherein the charged-particle radiation apparatus has a function of detecting, simultaneously with or separately from each other, an X-ray signal by the X-ray detector and a back scattered electron signal by the first back scattered electron detector.

2. The charged-particle radiation apparatus according to claim 1 having a function of analyzing an amount of back scattered electron signals in every pixel in a first back scattered electron image acquired by the first back scattered electron detector by using the first back scattered electron image such that an efficiency of detecting an X-ray in an observation range by the charged-particle radiation apparatus is at least evaluated or distinguished.

3. The charged-particle radiation apparatus according to claim 2 further comprising a second back scattered electron detector on an optical axis of primary charged-particle radiation, and also having a function of displaying the efficiency of detecting an X-ray in the observation range or a result of distinguishing the efficiency by superimposing it on a second back scattered electron image acquired by the second back scattered electron detector.

4. The charged-particle radiation apparatus according to claim 2 further comprising a secondary electron detector, and also having a function of displaying the efficiency of detecting an X-ray in the observation range or a result of distinguishing the efficiency by superimposing it on a secondary electron image acquired by the secondary electron detector.

5. The charged-particle radiation apparatus according to claim 2 having a function of displaying in dialog whether the observation range can be subjected to X-ray elemental analysis.

6. The charged-particle radiation apparatus according to claim 1 further comprising a second back scattered electron detector on an optical axis of primary charged-particle radiation, and also having a function of performing image processing analysis by using a second back scattered electron image obtained by the second back scattered electron detector and the first back scattered electron image obtained by the first back scattered electron detector such that an efficiency of detecting an X-ray in an observation range by the charged-particle radiation apparatus is at least evaluated or distinguished.

7. The charged-particle radiation apparatus according to claim 6 having a function of displaying the efficiency of detecting an X-ray in the observation range or a result of distinguishing the efficiency by superimposing it on the second back scattered electron image.

8. The charged-particle radiation apparatus according to claim 6 further comprising a secondary electron detector, and also having a function of displaying the efficiency of detecting an X-ray in the observation range or a result of distinguishing the efficiency by superimposing it on a secondary electron image acquired by the secondary electron detector.

9. The charged-particle radiation apparatus according to claim 6 having a function of displaying in dialog whether the observation range can be subjected to X-ray elemental analysis.

10. A charged particle radiation apparatus provided with an X-ray detector, wherein a first back scattered electron detector is disposed at a tip portion of the X-ray detector and at a position non-coaxial with an X-ray detection surface of the X-ray detector, and disposed integrally with or independently from the X-ray detector, and wherein the charged-particle radiation apparatus has a function of detecting, simultaneously with or separately from each other, an X-ray signal by the X-ray detector and a back scattered electron signal by the first back scattered electron detector.

11. The charged-particle radiation apparatus according to claim 10 having a function of analyzing an amount of back scattered electron signals in every pixel in the first back scattered electron image acquired by the first back scattered electron detector by using the first back scattered electron image such that an efficiency of detecting an X-ray in an observation range by the charged-particle radiation apparatus is at least evaluated or distinguished.

12. The charged-particle radiation apparatus according to claim 11 further comprising a secondary electron detector on an optical axis of primary charged-particle radiation, and also having a function of displaying the efficiency of detecting an X-ray in the observation range or a result of distinguishing the efficiency by superimposing it on a second back scattered electron image acquired by the second back scattered electron detector.

13. The charged-particle radiation apparatus according to claim 11 further comprising a secondary electron detector, and also having a function of displaying the efficiency of detecting an X-ray in the observation range or a result of distinguishing the efficiency by superimposing it on a secondary electron image acquired by the secondary electron detector.

14. The charged-particle radiation apparatus according to claim 11 having a function of displaying in dialog whether the observation range can be subjected to X-ray elemental analysis.

15. The charged-particle radiation apparatus according to claim 10 further comprising a second back scattered electron detector on an optical axis of primary charged-particle radiation, and also having a function of performing image processing analysis by using a second back scattered electron image obtained by the second back scattered electron detector and the first back scattered electron image obtained by the first back scattered electron detector such that an efficiency of detecting an X-ray in an observation range by the charged-particle radiation apparatus is at least evaluated or distinguished.

16. The charged-particle radiation apparatus according to claim 15 having a function of displaying the efficiency of detecting an X-ray in the observation range or a result of distinguishing the efficiency by superimposing it on the second back scattered electron image.

17. The charged-particle radiation apparatus according to claim 15 further comprising a secondary electron detector, and also having a function of displaying the efficiency of detecting an X-ray in the observation range or a result of distinguishing the efficiency by superimposing it on a secondary electron image acquired by the secondary electron detector.

18. The charged-particle radiation apparatus according to claim 15 having a function of displaying in dialog whether the observation range can be subjected to X-ray elemental analysis.

\* \* \* \* \*